(12) United States Patent
Huang et al.

(10) Patent No.: US 11,728,394 B2
(45) Date of Patent: Aug. 15, 2023

(54) METHOD OF FORMING BACKSIDE POWER RAILS

(71) Applicant: Taiwan Semiconductor Manufacturing Company, Ltd., Hsinchu (TW)

(72) Inventors: Po-Yu Huang, Hsinchu (TW); Chen-Ming Lee, Taoyuan County (TW); I-Wen Wu, Hsinchu (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 266 days.

(21) Appl. No.: 17/159,999

(22) Filed: Jan. 27, 2021

(65) Prior Publication Data

US 2022/0238660 A1 Jul. 28, 2022

(51) Int. Cl.
*H01L 29/40* (2006.01)
*H01L 29/66* (2006.01)
(Continued)

(52) U.S. Cl.
CPC ........ *H01L 29/401* (2013.01); *H01L 21/7624* (2013.01); *H01L 29/41775* (2013.01); *H01L 29/66742* (2013.01); *H01L 21/26506* (2013.01); *H01L 21/26513* (2013.01); *H01L 21/26586* (2013.01); *H01L 21/30604* (2013.01);
(Continued)

(58) Field of Classification Search
CPC ............... H01L 29/401; H01L 29/7624; H01L 29/41775; H01L 29/66742; H01L 29/42392; H01L 29/0673; H01L 29/66439; H01L 29/775; H01L 29/41766; H01L 29/165; H01L 29/76896; H01L 21/7624; H01L 21/26506; H01L 21/26513; H01L 21/26586; H01L 21/30604; H01L 21/76831; H01L 21/76877; H01L 21/3065; H01L 21/76897; H01L 21/30608;
(Continued)

(56) References Cited

U.S. PATENT DOCUMENTS 8,963,258 B2  2/2015  Yu et al.
9,818,872 B2  11/2017 Ching et al.
(Continued)

*Primary Examiner* — Dale E Page
*Assistant Examiner* — Quovaunda Jefferson
(74) *Attorney, Agent, or Firm* — Haynes and Boone, LLP

(57) ABSTRACT

A semiconductor structure and a method of forming the same are provided. In an embodiment, an exemplary method of forming the semiconductor structure includes forming a fin structure extending from a front side of a substrate, recessing a source region of the fin structure to form a source opening, forming a semiconductor plug under the source opening, planarizing the substrate to expose the semiconductor plug from a back side of the substrate, performing a pre-amorphous implantation (PAI) process to amorphize the substrate, replacing the amorphized substrate with a dielectric layer, and replacing the semiconductor plug with a backside source contact. By performing the PAI process, crystalline semiconductor is amorphized and may be substantially removed. Thus, the performance and reliability of the semiconductor structure may be advantageously improved.

20 Claims, 22 Drawing Sheets

(51) Int. Cl.
    *H01L 21/762*     (2006.01)
    *H01L 29/417*     (2006.01)
    *H01L 21/265*     (2006.01)
    *H01L 21/768*     (2006.01)
    *H01L 29/423*     (2006.01)
    *H01L 21/306*     (2006.01)

(52) U.S. Cl.
    CPC .. *H01L 21/76831* (2013.01); *H01L 21/76877* (2013.01); *H01L 29/42392* (2013.01)

(58) Field of Classification Search
    CPC ..... H01L 21/823461; H01L 21/823475; H01L 23/5286; B82Y 10/00; B82Y 40/00
    See application file for complete search history.

(56) References Cited

U.S. PATENT DOCUMENTS

| | | |
|---|---|---|
| 9,887,269 B2 | 2/2018 | Ching et al. |
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 11,411,100 B2 * | 8/2022 | Wang ................ H01L 29/42392 |
| 2015/0380509 A1 | 12/2015 | Tsai et al. |
| 2018/0175036 A1 | 6/2018 | Ching et al. |

* cited by examiner

METHOD OF FORMING BACKSIDE POWER RAILS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the dimensions of the multi-gate devices shrink, packing all contact features on one side of a substrate is becoming more and more challenging. To ease the packing density, it has been proposed to move some routing features, such as power lines (also referred to as power rails) to a backside of the substrate. While conventional backside power rail formation processes may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
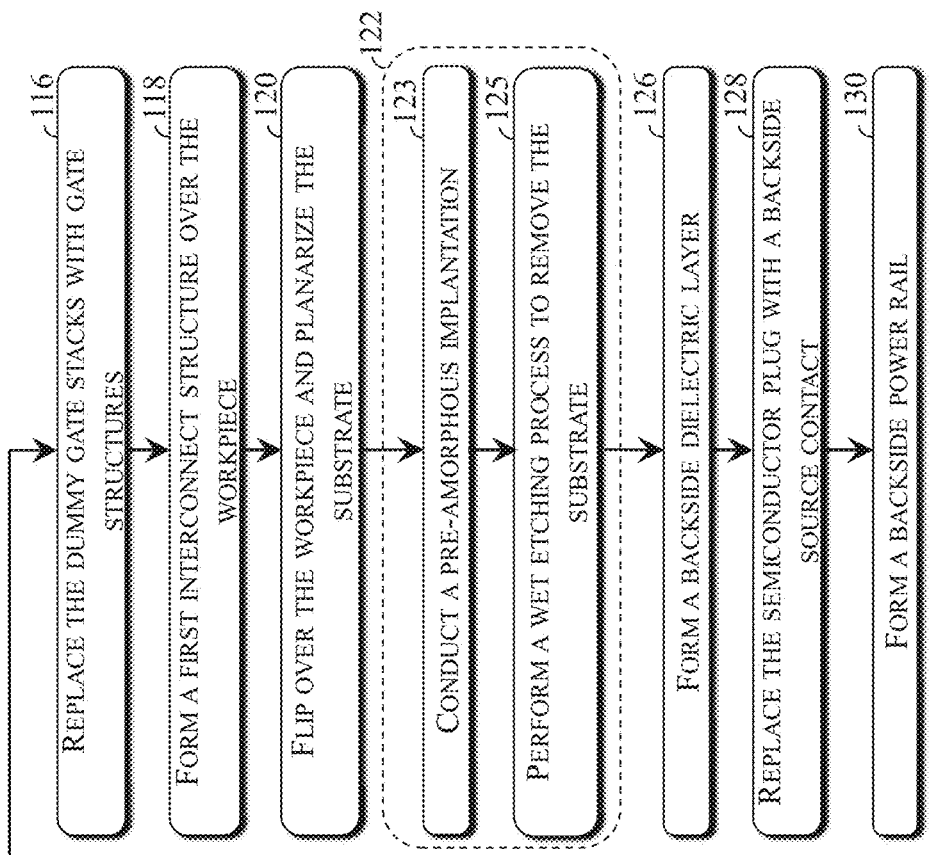
FIG. 1 illustrates a flow chart of a method for forming a semiconductor device having a backside power rail, according to one or more aspects of the present disclosure.
Figure 1:
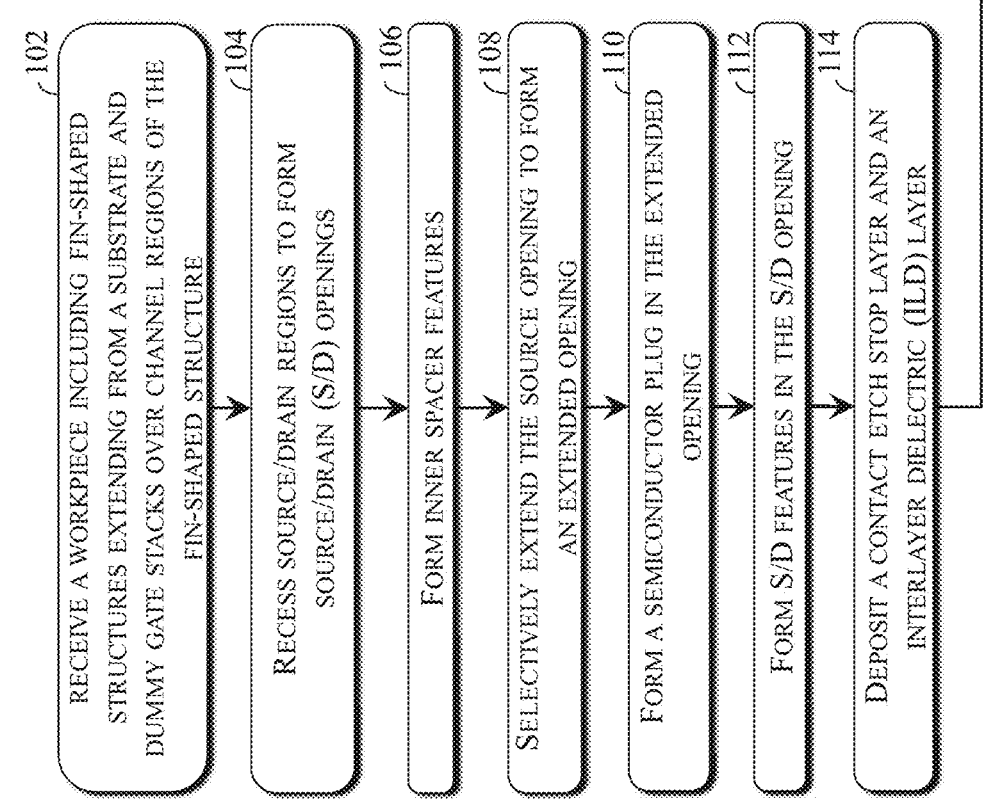

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Source/drain contacts of transistors on a substrate are used to connect source/drain features of the transistors to an interconnect structure over a front side of the substrate. As the dimensions of IC devices shrink, the process windows for forming these contacts are reduced, and parasitic capacitance associated with transistors may increase. Backside power rail (BPR) structure is a solution for performance boost on power delivery network (PDN) for advanced technology node and it eases the crowding of contacts. In some processes, an initial substrate for fabrication includes a semiconductor layer formed of silicon. Formation of backside power rails involves forming a dummy plug in the silicon layer, replacing the silicon layer with a dielectric layer, and replacing the dummy plug with a backside contact. In some implantations, to replace the silicon layer with the dielectric layer, a dry etching process may be used to remove the silicon layer. However, dry etching does not provide a good etch selectivity between the silicon layer and dummy plug, leading to a damaged and dimension-reduced dummy plug, and thus leading to a dimension-reduced backside contact. In addition, exposing frontside features (e.g., gate structures) to a bombardment of ions used in the dry etching process would disadvantageously influence performance of the device and/or induce reliability issues. In some implantations, a wet etching process may be used to selectively remove the silicon layer. However, silicon has different crystal planes. The etch rate is dependent on crystal planes of the silicon due to, for example, their different bond configurations and atomic densities. For example, a wet etching process etches silicon more slowly along the <111> crystal orientation than all the other crystal orientations (e.g., <110>, <100>) in the lattice. Due to the etch rate difference, a portion of silicon may not be fully removed by the wet etching process and would remain at the back side. The unremoved silicon would disadvantageously introduce a leakage path between the backside contact and adjacent gate structures. Additionally or alternatively, because the dielectric constant of silicon is greater than the dielectric layer that replaces the silicon layer, the unremoved or residual silicon may increase a parasitic capacitance of the semiconductor structure, inducing reliability issues of the semiconductor structure. Alternatively, if the wet etching process is allowed to completely etch away the residual silicon layer, the gate structures may be damaged.

The present disclosure provides processes for forming a backside power rail structure. In some embodiments, a fin-shape structure is formed over a semiconductor layer. A source region and a drain region of the fin-shape structure are recessed to form a source opening and a drain opening. Using photolithography techniques, the source opening is selectively extended through at least of a portion of the semiconductor layer to form an extended opening. A semiconductor plug is then formed to fill the extended opening. A source feature is formed in the source opening and over the silicon plug, and a drain feature is formed in the drain opening. After forming a functional gate structure and an interconnect structure over a front side of the workpiece, the workpiece is bonded to a carrier substrate, flipped over, and planarized to expose the semiconductor plug and the semiconductor layer. A pre-amorphous implantation (PAI) process is then performed to amorphize the lattice structure of the semiconductor layer and convert the crystalline semiconductor layer into an amorphous semiconductor layer. Without non-uniform etching due to different crystal orientations, the amorphous semiconductor layer would be uniformly etched under a wet etching process. The etchant in the wet etching process selectively removes the amorphous semiconductor layer without substantially etching the semiconductor plug. A dielectric layer is formed, and the semiconductor plug may be selectively removed to expose the source feature in a backside source contact opening. A backside source contact is then formed in the backside source contact opening. A backside power rail is then formed over the backside source contact.

The various aspects of the present disclosure will now be described in more detail with reference to the figures. In that regard, FIG. 1 is a flowchart illustrating method 100 of forming a semiconductor device according to embodiments of the present disclosure. Method 100 is described below in conjunction with FIGS. 2-17, which are fragmentary cross-sectional views of a workpiece 200 at different stages of fabrication according to embodiments of method 100. FIG. 18 is a flowchart illustrating exemplary operations in an alternative method 100' of forming a semiconductor device according to embodiments of the present disclosure. Method 100' is described below in conjunction with FIGS. 19-22, which are fragmentary cross-sectional views of a workpiece 200 at different stages of fabrication according to embodiments of method 100'. Methods 100 and 100' are merely examples and are not intended to limit the present disclosure to what is explicitly illustrated therein. Additional steps may be provided before, during and after the method 100 and/or method 100', and some steps described can be replaced, eliminated, or moved around for additional embodiments of the method. Not all steps are described herein in detail for reasons of simplicity. Because the workpiece 200 will be fabricated into a semiconductor device 200 upon conclusion of the fabrication processes, the workpiece 200 may be referred to as the semiconductor device 200 as the context requires. For avoidance of doubts, the X, Y and Z directions in FIGS. 2-17 and 19-22 are perpendicular to one another and are used consistently throughout FIGS. 2-17 and 19-22. Throughout the present disclosure, like reference numerals denote like features unless otherwise excepted.

Figure 2:
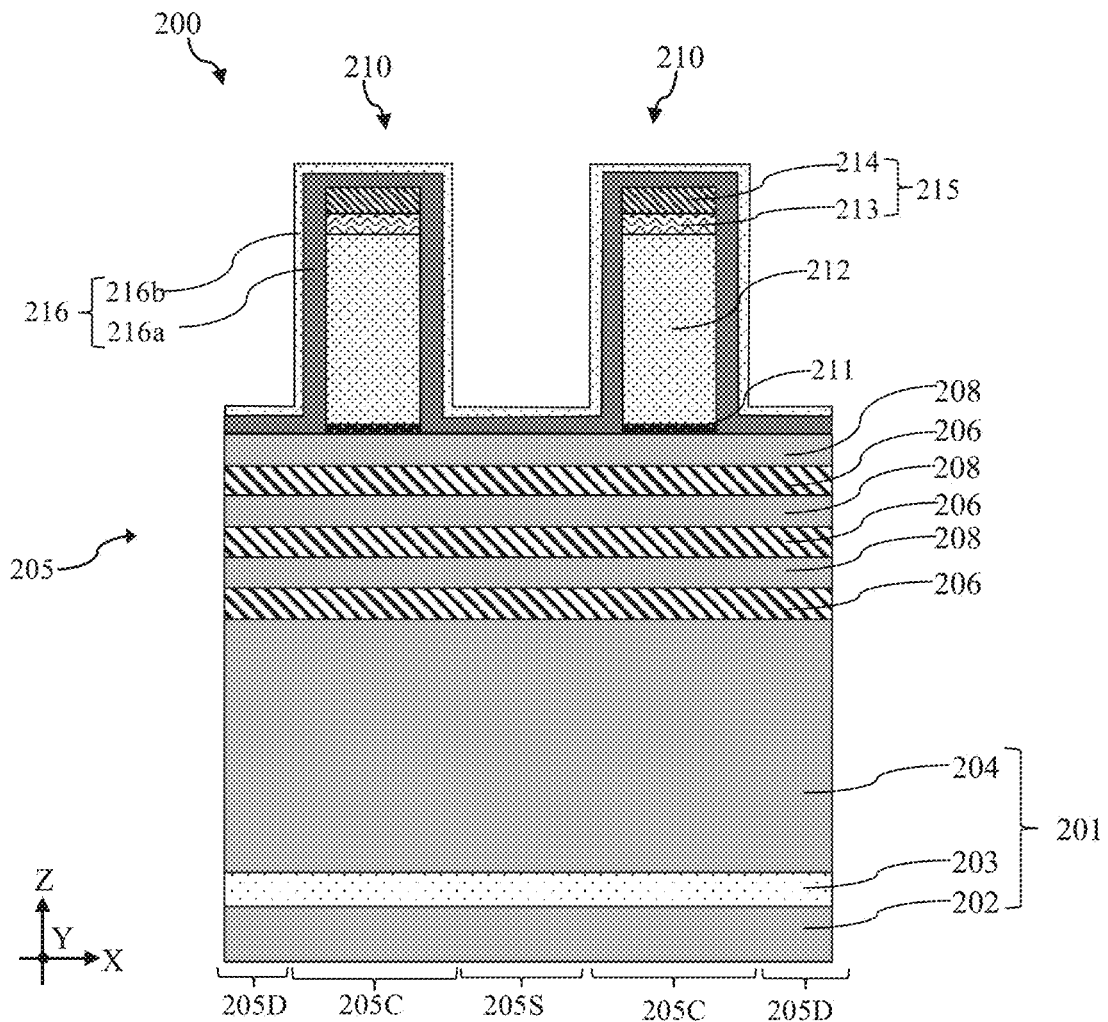
FIGS. 2-17 illustrate fragmentary cross-sectional views of a workpiece during various fabrication stages in the method of FIG. 1, according to one or more aspects of the present disclosure.

Referring to FIGS. 1 and 2, method 100 includes a block 102 where a workpiece 200 is received. The workpiece 200 includes a substrate 201. In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 201 may be a semiconductor-on-insulator substrate, such as a silicon-on-insulator (SOI) substrate, a silicon germanium-on-insulator (SGOI) substrate, or a germanium-on-insulator (GOI) substrate. In the depicted embodiment, the substrate 201 is an SOI substrate and includes a carrier layer 202, an insulator layer 203 on the carrier layer 202, and a semiconductor layer 204 on the insulator layer 203. Semiconductor-on-insulator substrates can be fabricated using separation by implantation of oxygen (SIMOX), wafer bonding, and/or other suitable methods. In some embodiments, the semiconductor layer 204 may be silicon, silicon germanium, germanium, or other suitable semiconductor and may be undoped or unintentionally doped with a very low dose of dopants. In this depicted example, the carrier layer 202 includes silicon, the insulator layer 203 includes silicon oxide, and the semiconductor layer 204 includes silicon (i.e., single-crystalline silicon).

The workpiece 200 includes a fin-shaped structure 205 disposed over the substrate 201. The fin-shaped structure 205 extends lengthwise along the X direction and is divided into channel regions 205C overlapped by dummy gate stacks 210 (to be described below), source regions 205S, and drain regions 205D. In this depicted example, two channel regions 205C, one source region 205S, and two drain regions 205D are shown in FIG. 2, but the workpiece 200 may include more source/drain regions and channel regions. The fin-shaped structure 205 may be formed from a portion of the semiconductor layer 204 and a vertical stack of alternating semiconductor layers 206 and 208 using a combination of lithography and etch steps. An exemplary lithography process includes spin-on coating a photoresist layer, soft baking of the photoresist layer, mask aligning, exposing, post-exposure baking, developing the photoresist layer, rinsing, and drying (e.g., hard baking). In some instances, the patterning of the fin-shaped structure 205 may be performed using double-patterning or multi-patterning processes to create patterns having pitches smaller than what is otherwise obtainable using a single, direct photolithography process. The etching process can include dry etching, wet etching, reactive ion etching (RIE), and/or other suitable processes. In the depicted embodiment, the vertical stack of alternating semiconductor layers 206 and 208 may include a plurality of channel layers 208 interleaved by a plurality of sacrificial layers 206. The channel layer 208 may be formed of silicon (Si) and the sacrificial layer 206 may be formed of silicon germanium (SiGe). The channel layers 208 and the sacrificial layers 206 may be epitaxially deposited on the substrate 201 using molecular beam epitaxy (MBE), vapor-phase epitaxy (VPE), ultra-high vacuum CVD (UHV-CVD), and/or other suitable epitaxial growth processes.

While not explicitly shown in FIG. 2, an isolation feature is also formed around the fin-shaped structure 205 to isolate the fin-shaped structure 205 from an adjacent fin-shaped structure. In some embodiments, the isolation feature is deposited in trenches that define the fin-shaped structure 205. Such trenches may extend through the channel layers 208 and sacrificial layers 206 and terminate in the substrate 201. The isolation feature may also be referred to as a shallow trench isolation (STI) feature. In an exemplary process, a dielectric material for the isolation feature is deposited over the workpiece 200 using CVD, subatmospheric CVD (SACVD), flowable CVD (FCVD), physical vapor deposition (PVD), spin-on coating, and/or other suitable process. Then the deposited dielectric material is planarized and recessed until the fin-shaped structure 205 rises above the isolation feature. The dielectric material for the isolation feature may include silicon oxide, silicon oxynitride, fluorine-doped silicate glass (FSG), a low-k dielectric, combinations thereof, and/or other suitable materials.

Still referring to FIG. 2, the workpiece 200 also includes dummy gate stacks 210 disposed over channel regions 205C of the fin-shaped structure 205. The channel regions 205C and the dummy gate stack 210 also define source regions 205S and drain regions 205D that are not vertically overlapped by the dummy gate stacks 210. Each of the channel regions 205C is disposed between a source region 205S and a drain region 205D along the X direction. Two dummy gate stacks 210 are shown in FIG. 2 but the workpiece 200 may include more dummy gate stacks 210. In this embodiment, a gate replacement process (or gate-last process) is adopted where the dummy gate stacks 210 serve as placeholders for functional gate structures. Other processes and configuration are possible. The dummy gate stack 210 includes a dummy dielectric layer 211, a dummy gate electrode layer 212 over the dummy dielectric layer 211, and a gate-top hard mask layer 215 over the dummy gate electrode layer 212. The dummy dielectric layer 211 may include silicon oxide. The dummy gate electrode layer 212 may include polysilicon. The gate-top hard mask layer 215 may be a multi-layer that includes a silicon oxide layer 213 and silicon nitride layer 214 formed on the silicon oxide layer 213. Suitable deposition process, photolithography and etching process may be employed to form the dummy gate stack 210.

As shown in FIG. 2, the workpiece 200 also includes a gate spacer layer 216 disposed over the workpiece 200. In this depicted example, the gate spacer layer 216 includes a first gate spacer layer 216a and a second gate spacer layer 216b deposited conformally over the workpiece 200, including over top surfaces and sidewalls of the dummy gate stacks 210 and top surfaces of the fin-shaped structure 205. The term "conformally" may be used herein for ease of description of a layer having substantially uniform thickness over various regions. In some implementations, a dielectric constant of the second gate spacer layer 216b is greater than that of the first gate spacer layer 216a, and the second gate spacer layer 216b is more etch resistant than the first gate spacer layer 216a. In some embodiments, the first gate spacer layer 216a may include silicon oxide, silicon oxycarbide, or a suitable low-k dielectric material. The second gate spacer layer 216b may include silicon carbonitride, silicon nitride, zirconium oxide, aluminum oxide, or a suitable dielectric material. The first gate spacer layer 216a and the second gate spacer layer 216b may be deposited over the dummy gate stacks 210 using processes such as, CVD, SACVD, FCVD, atomic layer deposition (ALD), PVD, or other suitable process.

Figure 3:
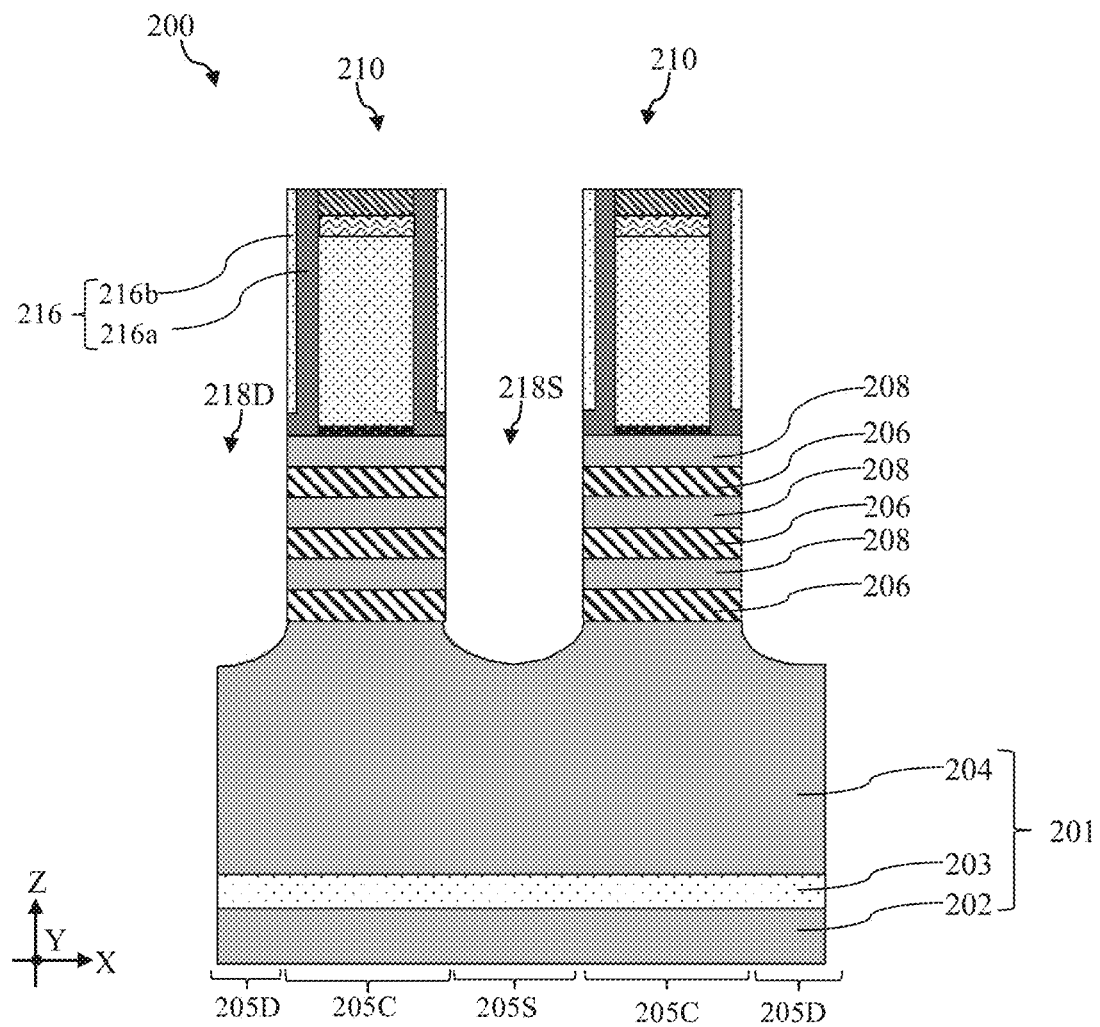

Referring to FIGS. 1 and 3, method 100 includes a block 104 where a source region 205S and two drain regions 205D of the fin-shaped structure 205 are recessed to form a source opening 218S and two drain openings 218D. In some embodiments, the source region 205S and drain regions 205D of the fin-shaped structures 205 that are not covered by the dummy gate stack 210 and the gate spacer layer 216 are anisotropically etched by a dry etch or a suitable etching process to form source opening 218S and two drain openings 218D. The etching process at block 104 may be a dry etching process or a suitable etching process. An exemplary dry etching process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In embodiments represented in FIG. 3, the source opening 218S and drain openings 218D extend through vertical stack of channel layers 208 and sacrificial layers 206. The source opening 218S and the drain openings 218D may partially extend into the semiconductor layer 204 of the substrate 201. As illustrated in FIG. 3, sidewalls of the channel layers 208 and the sacrificial layers 206 are exposed in the source opening 218S and drain openings 218D.

Figure 4:
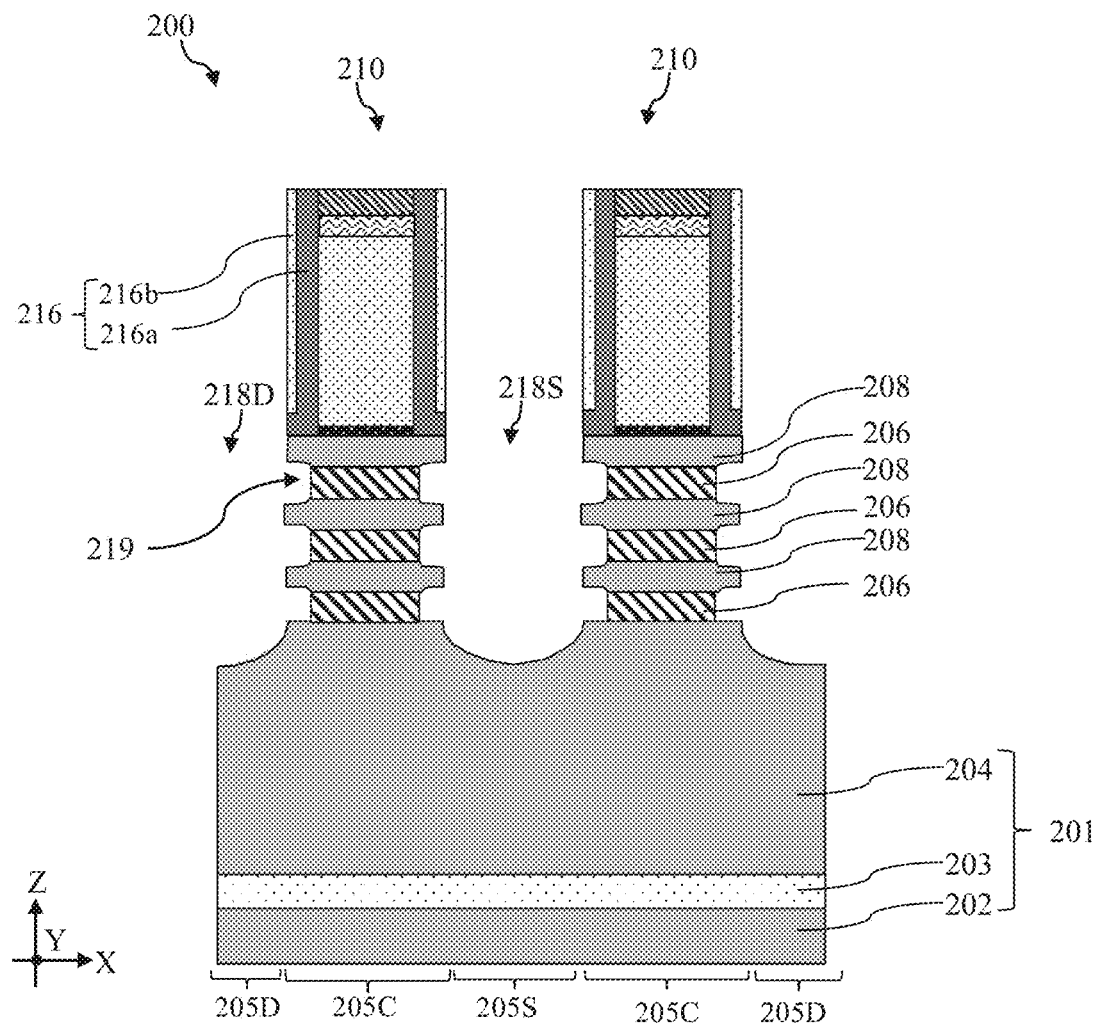
Figure 5:
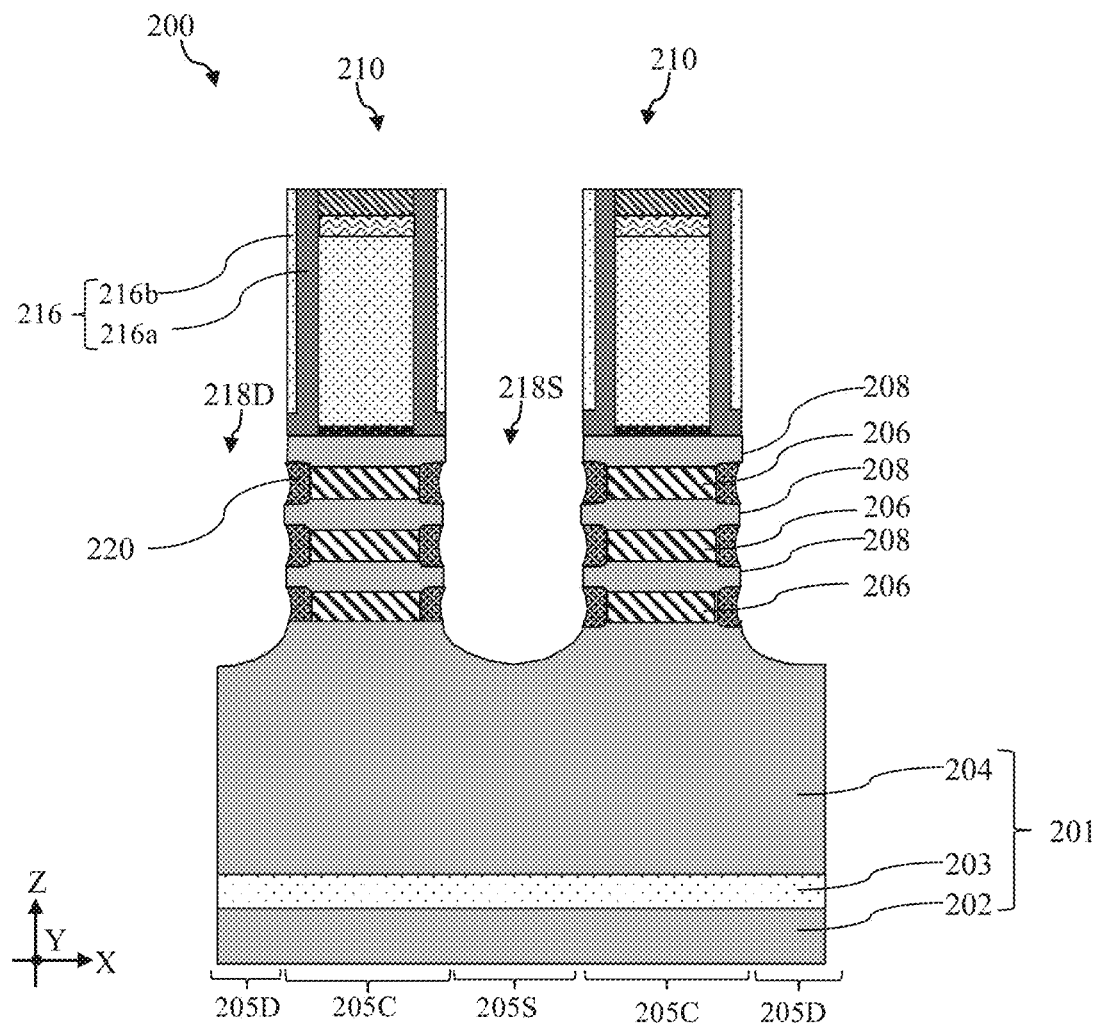

Referring to FIGS. 1 and 4-5, method 100 includes a block 106 where inner spacer features 220 are formed. After the formation of the source opening 218S and the drain openings 218D, the sacrificial layers 206 are exposed in the source opening 218S and the drain openings 218D. As shown in FIG. 4, the sacrificial layers 206 are selectively and partially recessed to form inner spacer recesses 219, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include use of a selective isotropic etching process (e.g., a selective dry etching process or a selective wet etching process), and the extent at which the sacrificial layers 206 are recessed is controlled by duration of the etching process. After the formation of the inner spacer recesses 219, an inner spacer material layer is deposited over the workpiece 200, including in the inner spacer recesses 219. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excessive inner spacer material layer over sidewalls of the channel layers 208, thereby forming the inner spacer features 220 as shown in FIG. 5. In some embodiments, the etch back process at block 106 may be a dry etching process and in a way similar to the dry etching process used in the formation of the source opening 218S and drain openings 218D.

Figure 6:
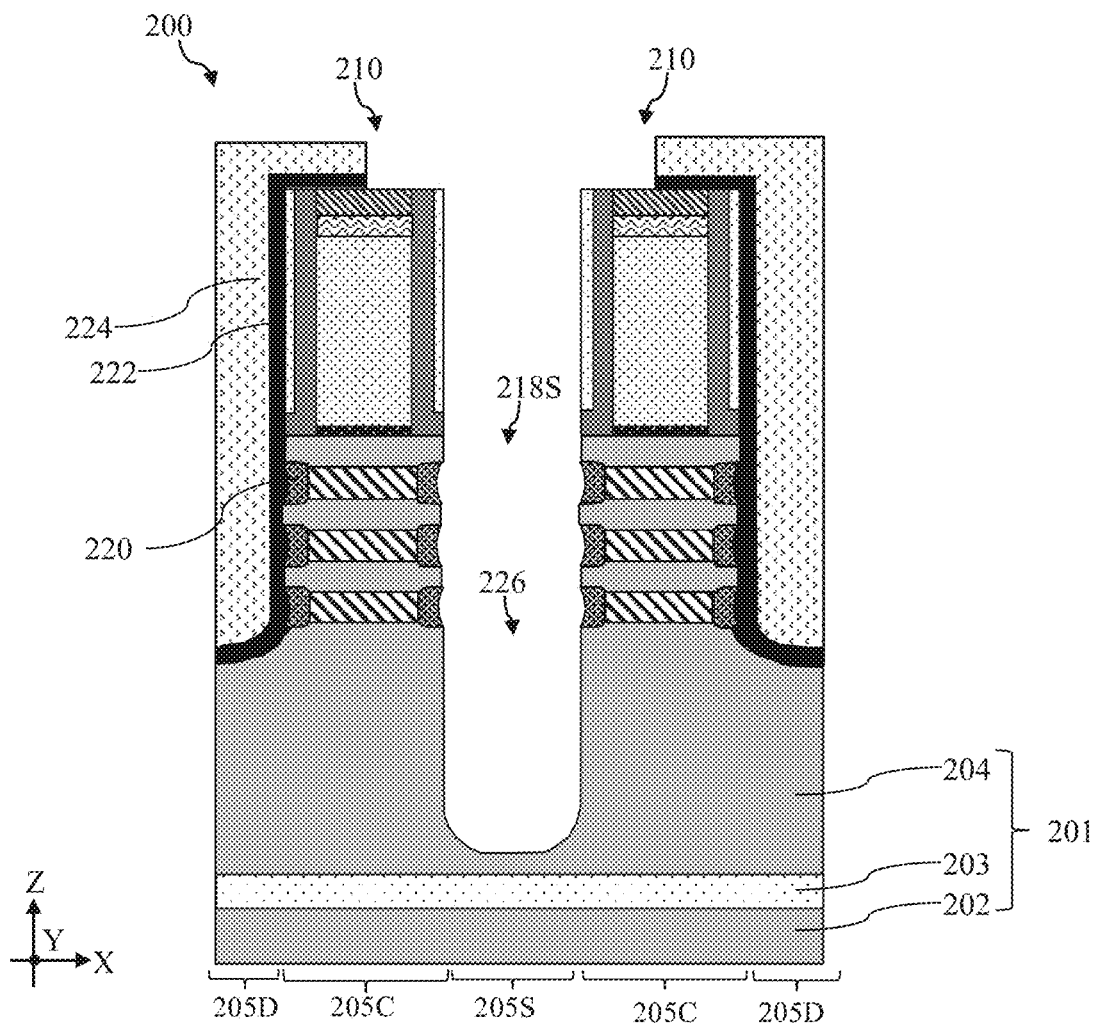

Referring to FIGS. 1 and 6, method 100 includes a block 108 where the source opening 218S is selectively extended into the semiconductor layer 204 to form an extended opening 226. In some embodiments, a mask film 222 is deposited over the workpiece 200 using CVD or ALD and then a photoresist layer 224 is deposited over the mask film 222 using spin-on coating or a suitable process. The photoresist layer 224 is patterned using photolithography process to form a patterned photoresist layer 224. The patterned photoresist layer 224 is then applied as an etch mask in an etching process to pattern the mask film 222. As shown in FIG. 6, the patterned photoresist layer 224 and the patterned mask film 222 cover/protect the drain openings 218D while the source opening 218S is exposed. An anisotropic etching process is then performed to extend the source opening 218S into the semiconductor layer 204 to form an extended opening 226. In some implementations, the anisotropic etching process at block 108 may be a dry etching process and in a way similar to the dry etching process used in the formation of the source opening 218S and drain openings 218D. In some embodiments, the mask film 222 may include silicon oxide, silicon nitride, silicon oxynitride, silicon oxycarbonitride, silicon carbide, or silicon oxycarbide.

Figure 7:
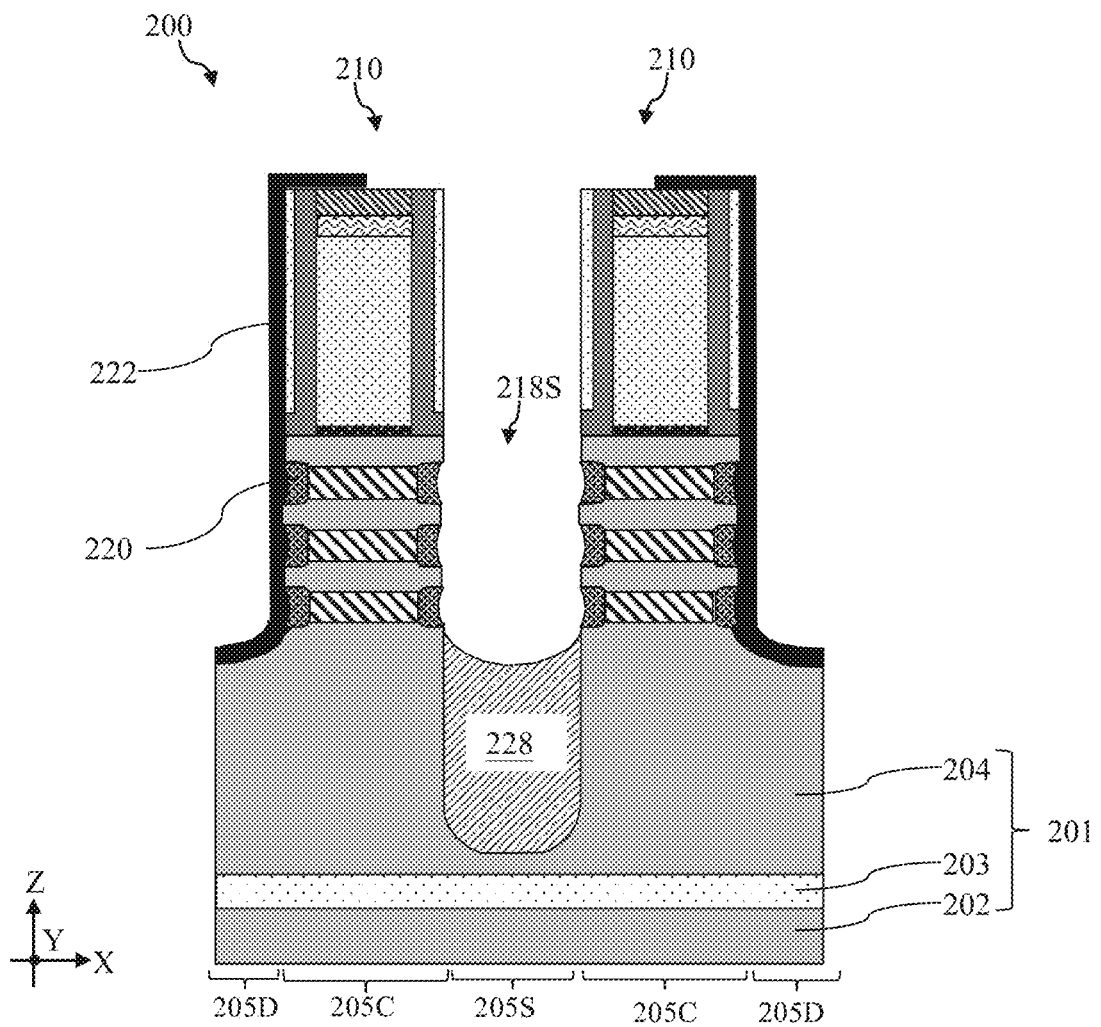

Referring to FIGS. 1 and 7, method 100 includes a block 110 where a semiconductor plug 228 is formed in the extended opening 226. In some embodiments, operations at block 110 may include a pre-clean process to remove native oxide and the photoresist layer 224. The pre-clean process may include use of RCA SC-1 (a mixture of ammonium hydroxide, hydrogen peroxide and water) and/or RCA SC-2 (a mixture of hydrochloric acid, hydrogen peroxide and water). After the pre-clean process, with the mask film 222 still covering sidewalls of the drain openings 218D, the semiconductor plug 228 may be selectively formed in the extended opening 226 using molecular beam epitaxy (MBE), vapor-phase epitaxy (VPE), ultra-high vacuum CVD (UHV-CVD)), and/or other suitable epitaxial growth processes. The composition of the semiconductor plug 228 is different from that of the semiconductor layer 204 such that the semiconductor layer 204 may be selectively removed in a subsequent process. For example, when the semiconductor layer 204 is formed of silicon, the semiconductor plug 228 may include SiGe, boron-doped silicon (Si:B), phosphorus-doped silicon (Si:P), boron-doped SiGe (SiGe:B), arsenic-doped silicon (Si:As) or other suitable material such that the semiconductor layer 204 may be selectively removed without substantially etching the semiconductor plug 228. After the formation of the semiconductor plug 228, the mask film 222 covering the drain openings 218D is selectively removed using a suitable etching process.

Figure 8:
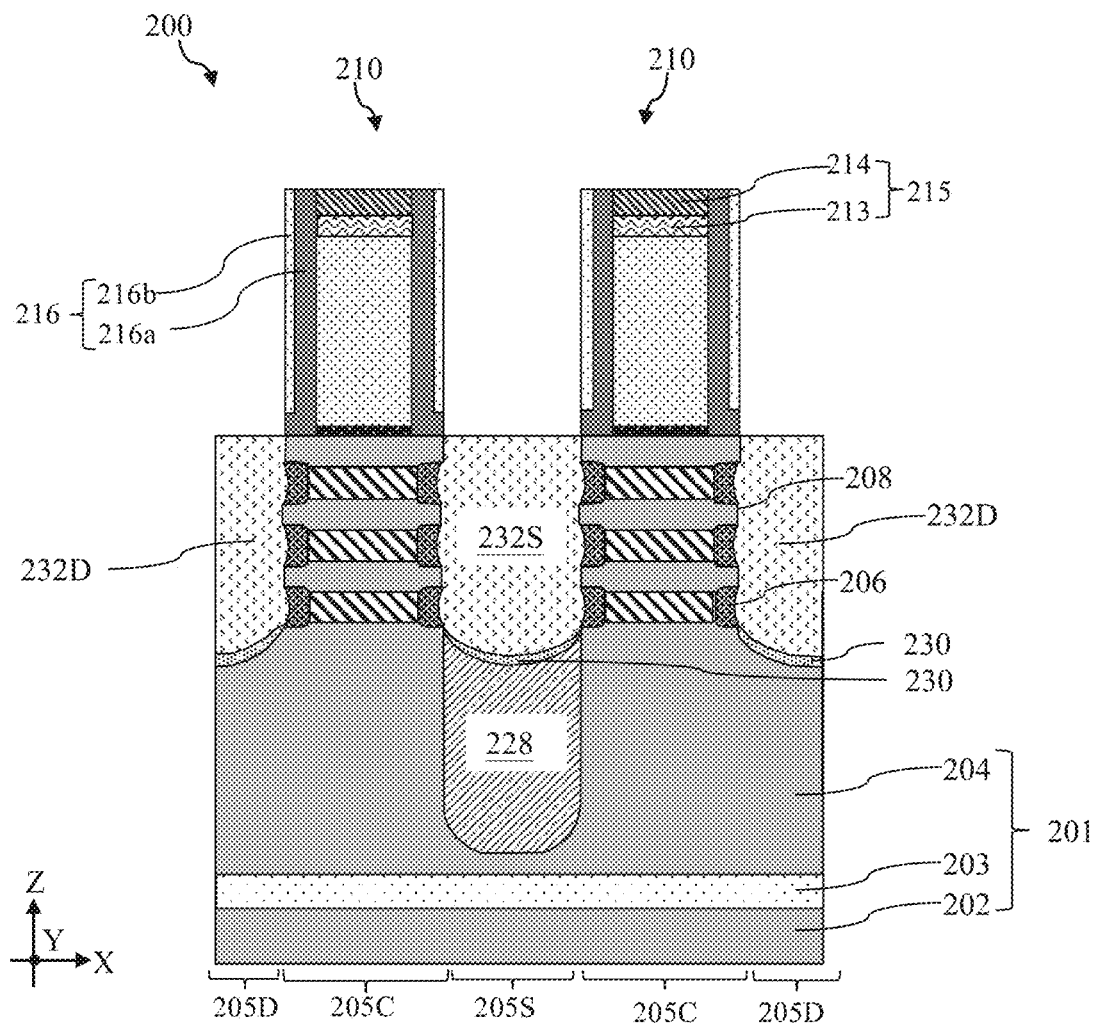

Referring to FIGS. 1 and 8, method 100 includes a block 112 where a source feature 232S is formed in the source opening 218S and a drain feature 232D is formed in the drain opening 218D. In this illustrated example, after removing the mask film 222, an epitaxial semiconductor feature 230 is formed at the bottom of the source opening 218S (and over the semiconductor plug 228) and at the bottom of the drain openings 218D to reduce or substantially prevent a leakage between the to-be-formed source/drain features 232S/232D and the semiconductor layer 204 and/or features to be formed at the backside of the workpiece 200. The epitaxial semiconductor feature 230 may be epitaxially and selectively formed from the exposed top surfaces of the semiconductor layer 204 or the semiconductor plug 228 by using an epitaxial process, such as an MBE process, a VPE process, an UHV-CVD process, an MOCVD process, and/or other suitable epitaxial growth processes. A bottom surface of the epitaxial semiconductor feature 230 generally tracks the shape of the bottom surface of the drain openings 218D or the exposed top surface of the semiconductor plug 228. Because surfaces of the inner spacer features 220 are not conducive to epitaxial deposition of the epitaxial semiconductor feature 230, the epitaxial semiconductor feature 230 is formed in a bottom-up fashion from the exposed surface of the substrate 201. A cross-sectional view of the epitaxial semiconductor feature 230 includes a crescent shape. Depending on the conductivity type of the overlying source feature 232S, the epitaxial semiconductor feature 230 may have different compositions. When the source feature 232S is n-type, the epitaxial semiconductor feature 230 may include undoped silicon (Si), phosphorus-doped silicon (Si:P), or arsenic-doped silicon (Si:As). When the source feature 232S is p-type, the epitaxial semiconductor feature 230 may include undoped silicon germanium (SiGe) or boron-doped silicon germanium (SiGe:B). In some implementations where the epitaxial semiconductor feature 230 includes silicon germanium, a germanium content in the epitaxial semiconductor feature 230 is less than a germanium content in the semiconductor plug 228 to introduce etch selectivity between the epitaxial semiconductor feature 230 and the semiconductor plug 228. When the epitaxial semiconductor feature 230 is doped, the epitaxial semiconductor feature 230 and the overlying source feature 232S may share the same dopant but at a lower concentration.

The source feature 232S and the drain feature 232D each may be then formed over the epitaxial semiconductor feature 230 by using an epitaxial process, such as VPE, UHV-CVD, MBE, and/or other suitable processes. The epitaxial process may use gaseous and/or liquid precursors, which interact with the composition of the epitaxial semiconductor feature 230. The source feature 232S and the drain feature 232D are therefore coupled to the channel layers 208 in the channel regions 205C of the fin-shape structure 205. Depending on the conductivity type of the to-be-formed transistor, the source feature 232S and the drain feature 232D may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. In some embodiments, a lightly doped epitaxy semiconductor layer may be formed between the source/drain feature 232S/232D and the corresponding epitaxial semiconductor feature 230, and a doping concentration of the second epitaxy semiconductor layer is less than a doping concentration of the source/drain feature 232S/232D.

Figure 9:
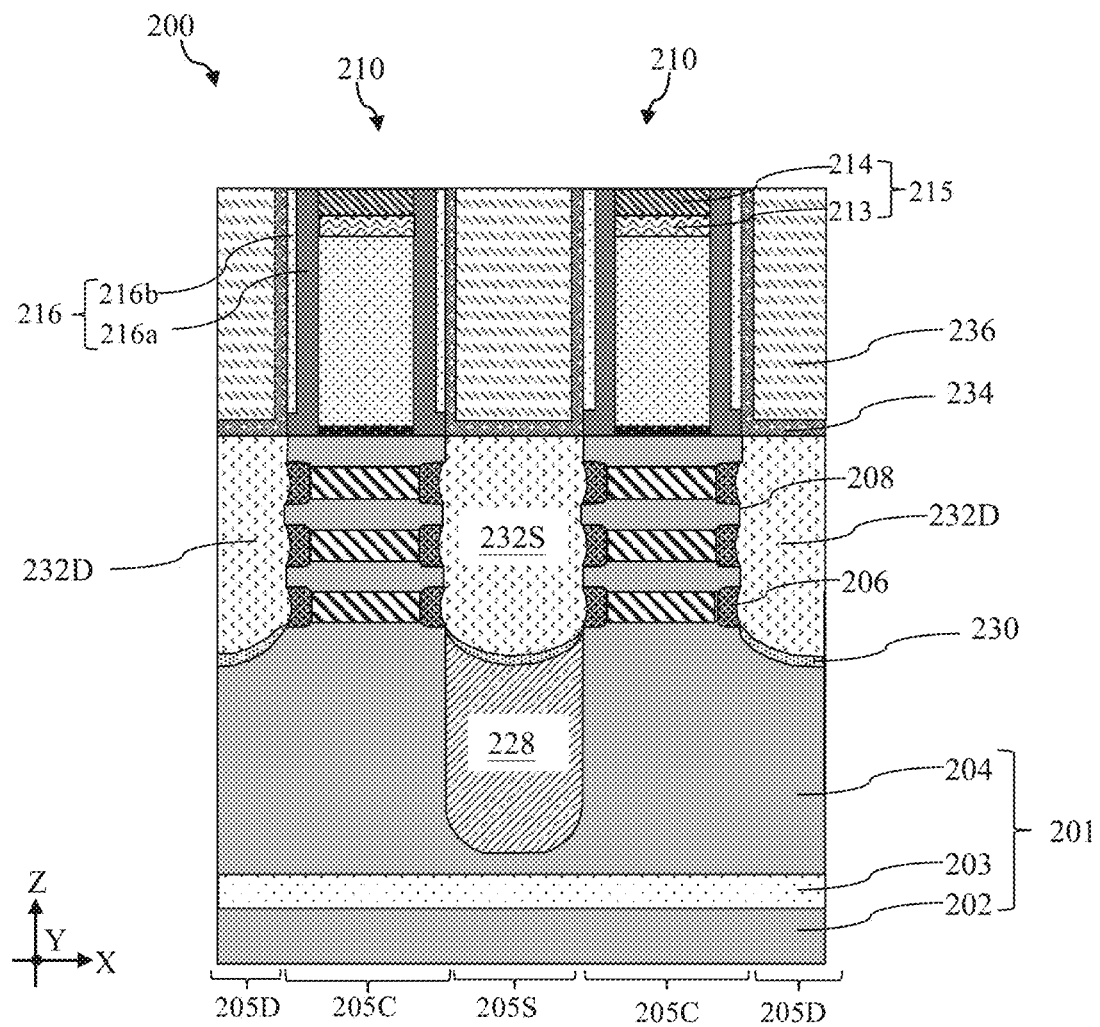

Referring to FIGS. 1 and 9, method 100 includes a block 114 where a contact etch stop layer (CESL) 234 and an interlayer dielectric layer (ILD) layer 236 are deposited over the workpiece 200. The CESL 234 may include silicon nitride, silicon oxynitride, and/or other materials known in the art and may be formed by ALD, plasma-enhanced chemical vapor deposition (PECVD) process and/or other suitable deposition or oxidation processes. As shown in FIG. 9, the CESL 234 may be deposited on top surfaces of the source feature 232S, the drain features 232D, and sidewalls of the gate spacer layer 216. The ILD layer 236 is deposited by a PECVD process or other suitable deposition technique over the workpiece 200 after the deposition of the CESL 234. The ILD layer 236 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the ILD layer 236, the workpiece 200 may be annealed to improve integrity of the ILD layer 236.

Figure 10:
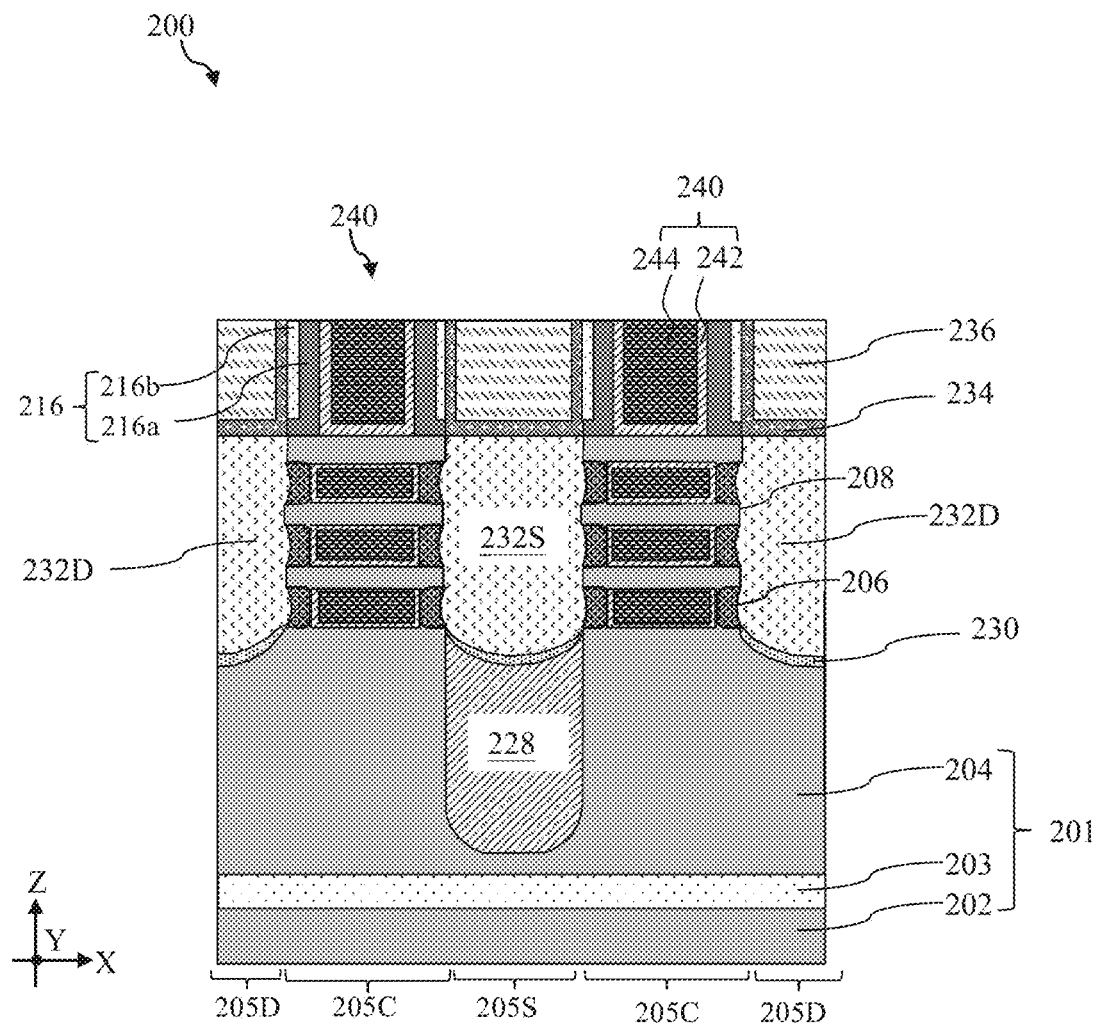

Referring to FIGS. 1 and 10, method 100 includes a block 116 where the dummy gate stacks 210 are replaced with the functional gate structures 240. A planarization process, such a chemical mechanical polishing (CMP) process may be performed to the workpiece 200 to remove excessive materials and expose top surfaces of the dummy gate stacks 210. With the exposure of the dummy gate stacks 210, block 116 proceeds to removal of the dummy gate stacks 210. The removal of the dummy gate stacks 210 may include one or more etching process that are selective to the material in the dummy gate stacks 210. For example, the removal of the dummy gate stacks 210 may be performed using a selective wet etch, a selective dry etch, or a combination thereof. After the removal of the dummy gate stacks 210, the sacrificial layers 206 are selectively removed to release the channel layers 208 as channel members 208 in the channel regions 205C. The selective removal of the sacrificial layers 206 may be implemented by a selective dry etch, a selective wet etch, or other selective etching process. In some embodiments, the selective wet etching includes an APM etch (e.g., ammonia hydroxide-hydrogen peroxide-water mixture).

The gate structures 240 are deposited to wrap over the channel members 208. Each of the gate structures 240 includes a gate dielectric layer 242 and a gate electrode layer 244 over the gate dielectric layer 242. In some embodiments, the gate dielectric layer 242 includes an interfacial layer disposed on the channel members 208 and a high-k dielectric layer over the interfacial layer. Here, a high-k dielectric layer refers to a dielectric material having a dielectric constant greater than that of silicon dioxide, which is about 3.9. In some embodiments, the interfacial layer includes silicon oxide and may be formed in a pre-clean process similar to the pre-clean process described with reference to FIG. 7. The high-k dielectric layer is then deposited over the interfacial layer using ALD, CVD, and/or other suitable methods. The high-k dielectric layer may include hafnium oxide. Alternatively, the high-k dielectric layer may include other high-k dielectrics, such as titanium oxide, hafnium zirconium oxide, tantalum oxide, hafnium silicon oxide, zirconium silicon oxide, lanthanum oxide, aluminum oxide, yttrium oxide, $SrTiO_3$, $BaTiO_3$, $BaZrO$, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

The gate electrode layer 244 is then deposited over the gate dielectric layer 242 using ALD, PVD, CVD, e-beam evaporation, or other suitable methods. The gate electrode layer 244 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 244 may include titanium nitride, titanium aluminum, titanium aluminum nitride, tantalum nitride, tantalum aluminum, tantalum aluminum nitride, tantalum aluminum carbide, tantalum carbonitride, aluminum, tungsten, nickel, titanium, ruthenium, cobalt, platinum, tantalum carbide, tantalum silicon nitride, copper, other refractory metals, or other suitable metal materials or a combination thereof. Further, where the semiconductor device 200 includes n-type transistors and p-type transistors, different gate electrode layers may be formed separately for n-type transistors and p-type transistors, which may include different work function metal layers (e.g., for providing different n-type and p-type work function metal layers).

Figure 11:
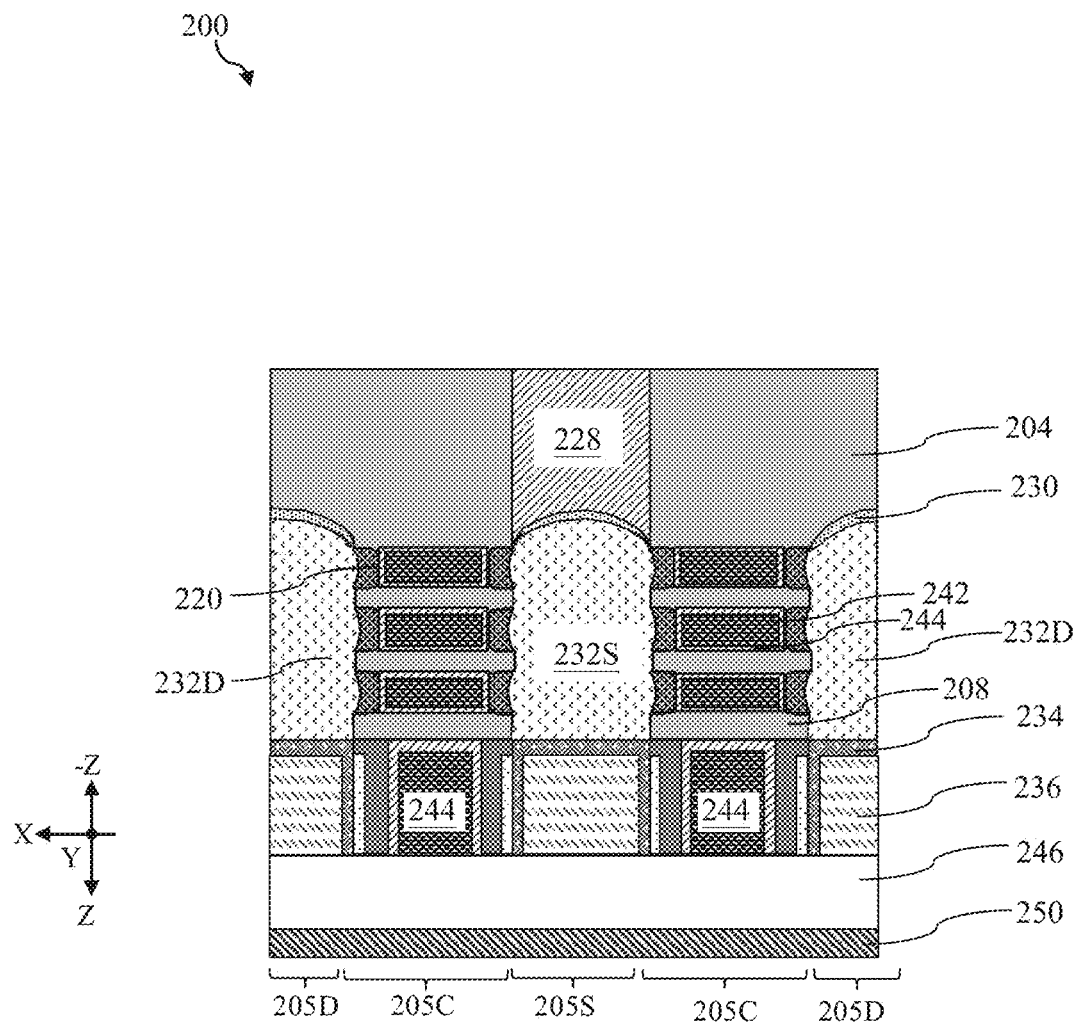

Referring to FIGS. 1 and 11, method 100 includes a block 118 where a first interconnect structure 246 is formed over the workpiece 200. In some embodiments, the first interconnect structure 246 may include multiple intermetal dielectric (IMD) layers and multiple metal lines or contact vias in each of the IMD layers. In some instances, the IMD layers and the ILD layer 236 may share similar composition. The metal lines and contact vias in each IMD layer may be formed of metal, such as aluminum, tungsten, ruthenium, or copper. In some embodiments, the metal lines and contact vias may be lined by a barrier layer to insulate the metal lines and contact vias from the IMD layers and to prevent electro-migration. Because the first interconnect structure 246 is formed over the front side of the workpiece 200, the first interconnect structure 246 may also be referred to as a frontside interconnect structure 246.

Still referring to FIGS. 1 and 11, method 100 includes a block 120 where a carrier substrate 250 is bonded to the first interconnect structure 246 and the workpiece 200 is flipped over and planarized to expose the semiconductor plug 228. In some embodiments, the carrier substrate 250 may be bonded to the workpiece 200 by fusion bonding, by use of an adhesion layer, or a combination thereof. In some instances, the carrier substrate 250 may include semiconductor materials (such as silicon), sapphire, glass, polymeric materials, or other suitable materials. In embodiments where fusion bonding is used, the carrier substrate 250 includes a bottom oxide layer and the first interconnect structure 246 includes a top oxide layer. After both the bottom oxide layer and top oxide layer are treated, they are placed in flush contact with one another for direct bonding at room temperature or at an elevated temperature. Once the carrier substrate 250 is bonded to the first interconnect structure 246 of the workpiece 200, the workpiece 200 is flipped over, as shown in FIG. 11, the substrate 201 is at the top and is disposed over the channel members 208. The back side of the workpiece 200 is then planarized to remove the carrier layer 202, the insulator layer 203, and a portion of the semiconductor layer 204 to expose the semiconductor plug 228.

Figure 12:
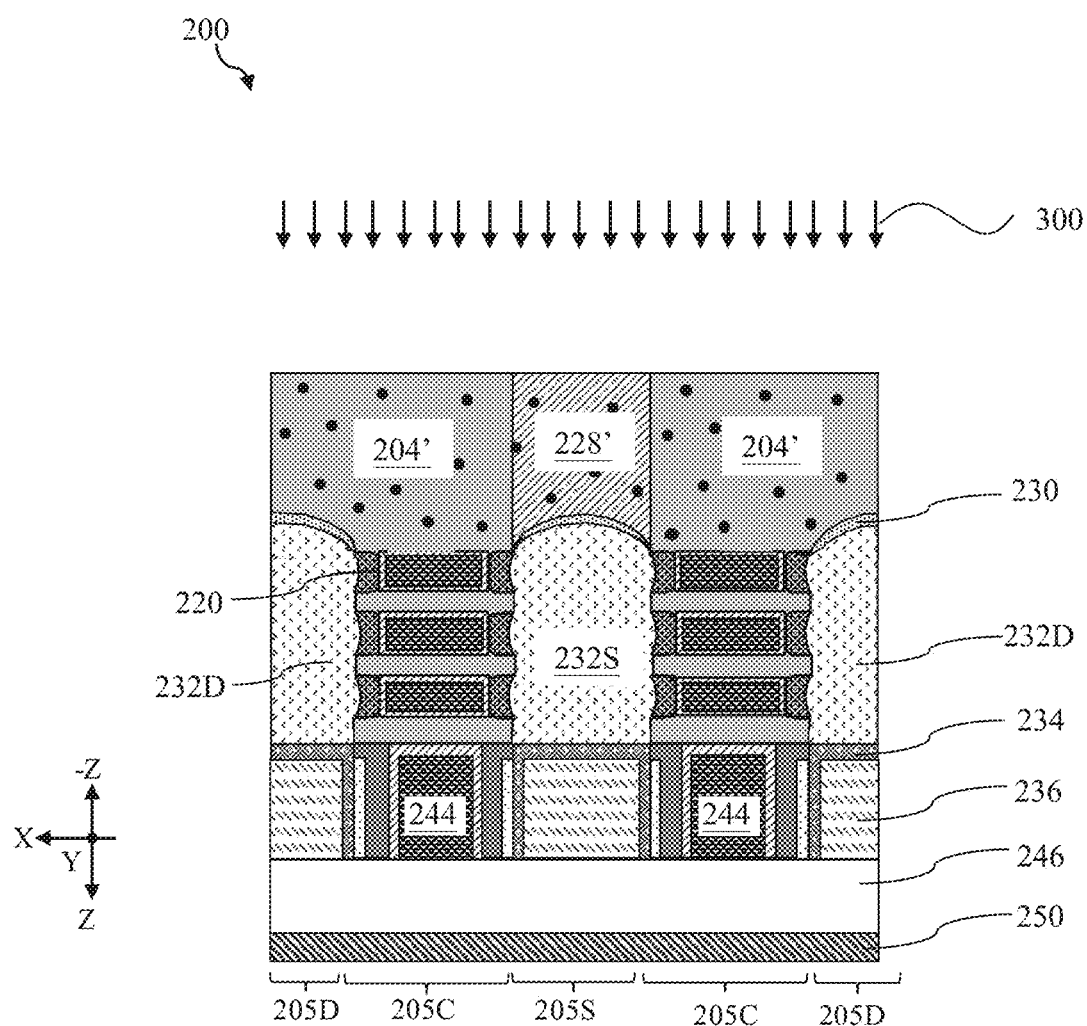
Figure 13:
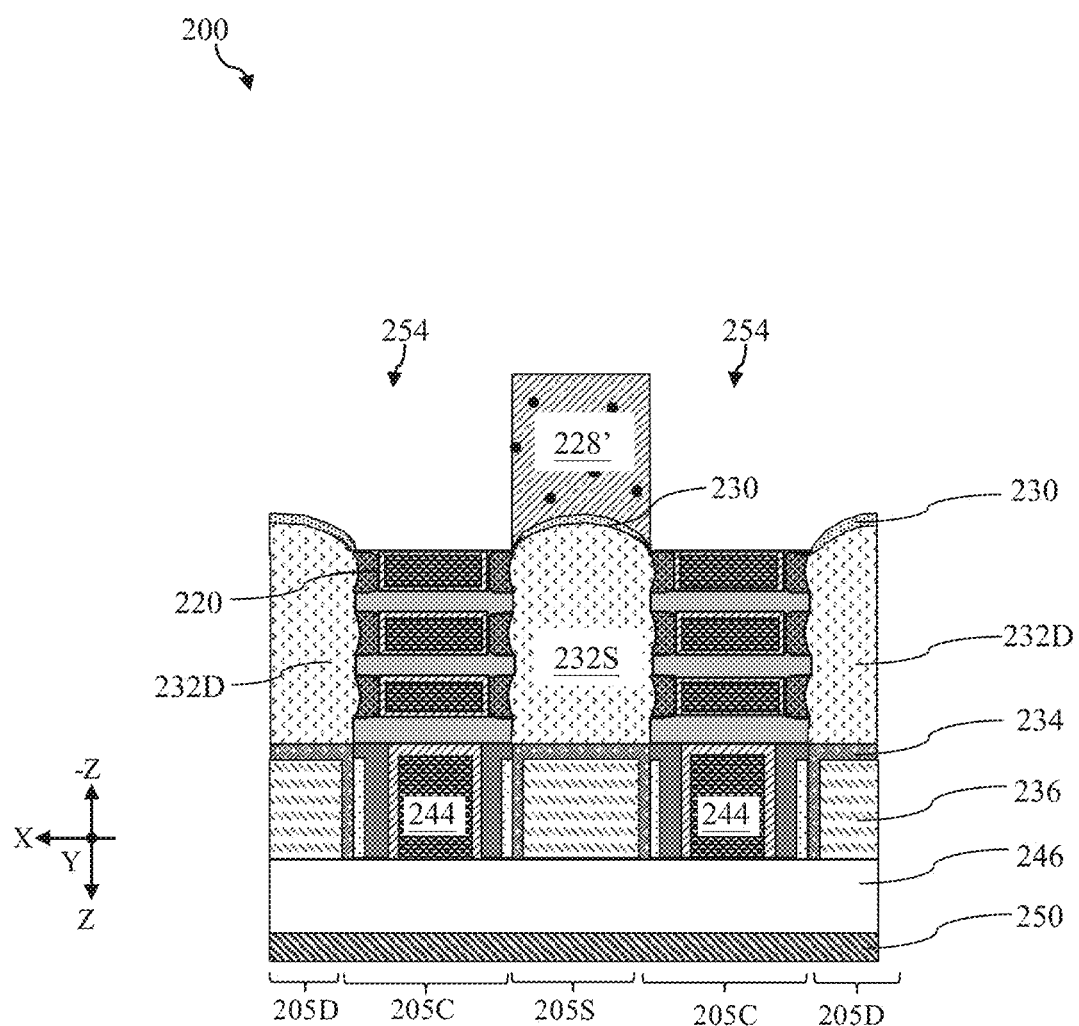

Referring to FIGS. 1 and 12-13, method 100 includes a block 122 where the semiconductor layer 204 is selectively removed to form dielectric openings 254. In this embodiment, as shown in FIG. 12, the removal of the semiconductor layer 204 includes, at block 123, performing a pre-amorphous implantation (PAI) process 300 to amorphize the semiconductor layer 204. The PAI process 300 implants the semiconductor layer 204 with an implant species, randomizing the lattice structure of the semiconductor layer 204 and forming amorphous semiconductor layer 204'. In PAI process 300, the implant species may include Si, C, Ge, Xe, Ar, B, or other suitable species. In the depicted embodiment, the PAI process 300 implants Ge, Ar, or B at an implant energy from about 5 KeV to about 40 KeV, a dosage in a range from about 1 E13 atoms/cm$^2$ to about 1 E16 atoms/cm$^2$, a temperature in a range from about −30° C. to about 30° C., and an implant angle (an angle between the implant ion beam and the −Z axis) in a range of 0° to about 30°. In this depicted example, the implant angle is about 0°. That is, the implant ion beam of the PAI process 300 is substantially perpendicular to the backside of the semiconductor layer 204. The PAI process 300 is controlled such that the semiconductor layer 204 in the workpiece 200 is fully amorphized. Considering the shrunk dimensions of IC devices, misalignment during mask aligning in a lithography process, and fabrication cost, no masking layer is formed on the semiconductor plug 228 during the PAI process. Thus, at least a portion of the semiconductor plug 228 is amorphized and would include amorphous semiconductor plug (e.g., a-SiGe). The semiconductor plug 228 after the PAI process 300 is herein interchangeably referred as to amorphous semiconductor plug 228'. It is observed that the PAI process 300 does not change the etch selectivity between the amorphous semiconductor plug 228' and the amorphous semiconductor layer 204'. After the PAI process 300, the gate structures 240 adjacent to the amorphous semiconductor layer 204' and the source feature 232S adjacent to the amorphous semiconductor plug 228' may also include the implant species (e.g., Ge, Ar, or, B) used in the PAI process 300.

The removal of the semiconductor layer 204 also includes, at block 125, performing a wet etching process to selectively remove the amorphous semiconductor layer 204' and form dielectric openings 254, as shown in FIG. 13. The wet etching process may implement an alkaline wet etchant solution that includes KOH, TMAH (tetramethylammonium hydroxide), NH$_4$OH, other suitable chemicals, or combinations thereof. As described above, along different crystal orientations in the lattice, wet etching etches silicon at different etch rates. Due to the etch rates difference, a portion of silicon, such as a portion of the silicon adjacent the semiconductor plug 228, may not be removed without damaging the gate structures 240 and would remain at the back side after the wet etching. By converting the semiconductor layer 204 into amorphous semiconductor layer 204', the lattice structures in the semiconductor layer 204 are randomized, and the etch rate difference may be substantially eliminated. The amorphous semiconductor layer 204' may be substantially removed by the wet etching process to form the dielectric openings 254. As alkaline etchants etch amorphous silicon more slowly than they do crystalline silicon, a concentration of the wet etchant solution used in block 125 may be increased to make up for the slower etching rate and thus improve fabrication efficiency. For example, when a NH$_4$OH solution is used to remove the amorphous semiconductor layer 204', the concentration of the NH$_4$OH solution may be between about 1:5 and about 1:20, which is higher than a concentration of NH$_4$OH solution used for etching crystalline semiconductor layer 204 in block 151 of FIG. 18 (to be described below). In some embodiments, the concentration of the NH$_4$OH solution used for removing the amorphous semiconductor layer 204' is about 5 to about 10 times of the concentration of the NH$_4$OH solution used for etching crystalline semiconductor layer 204 in block 151 of FIG. 18. The duration of the etching process in block 125 may be between about 60 seconds and about 300 seconds. The process temperature may be between about 50° C. and about 70° C.

Figure 14:
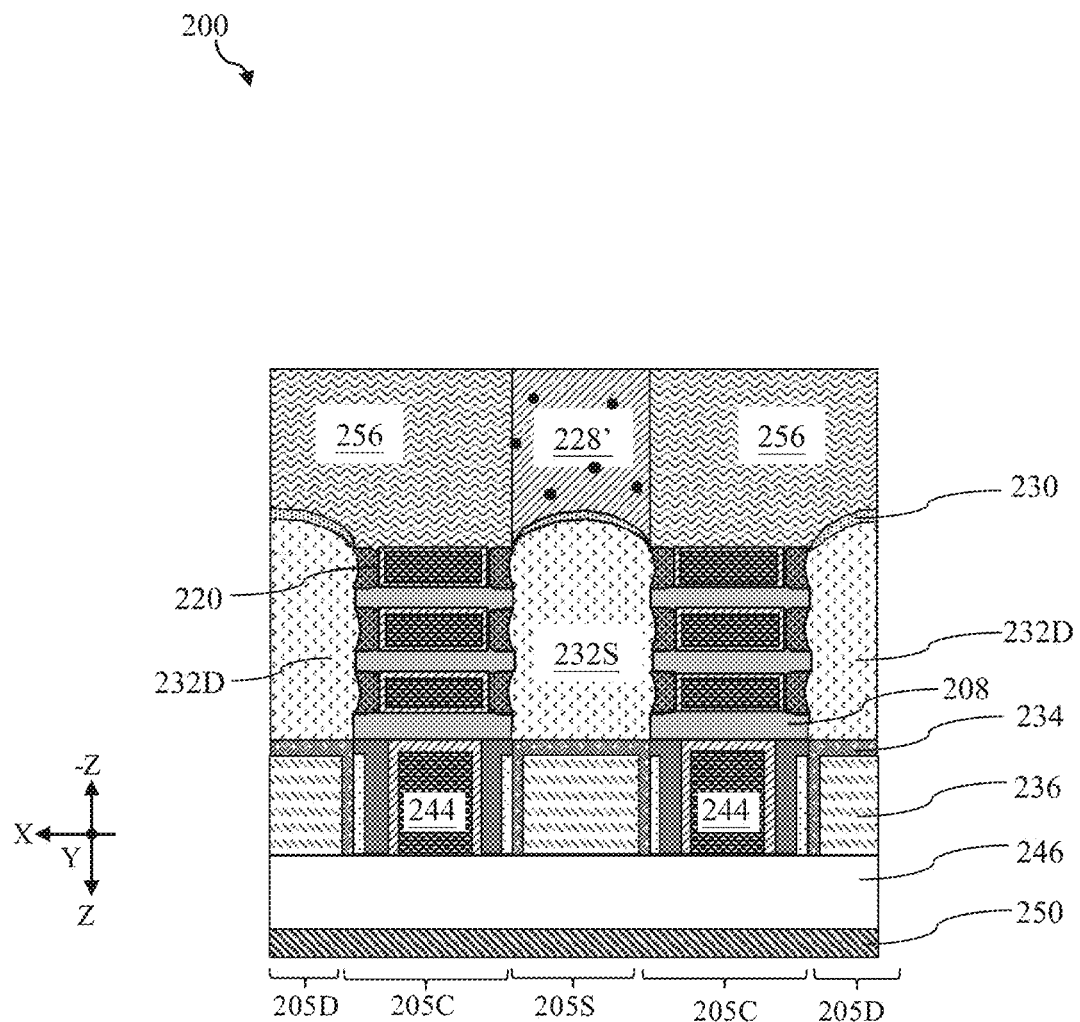
Figure 15:
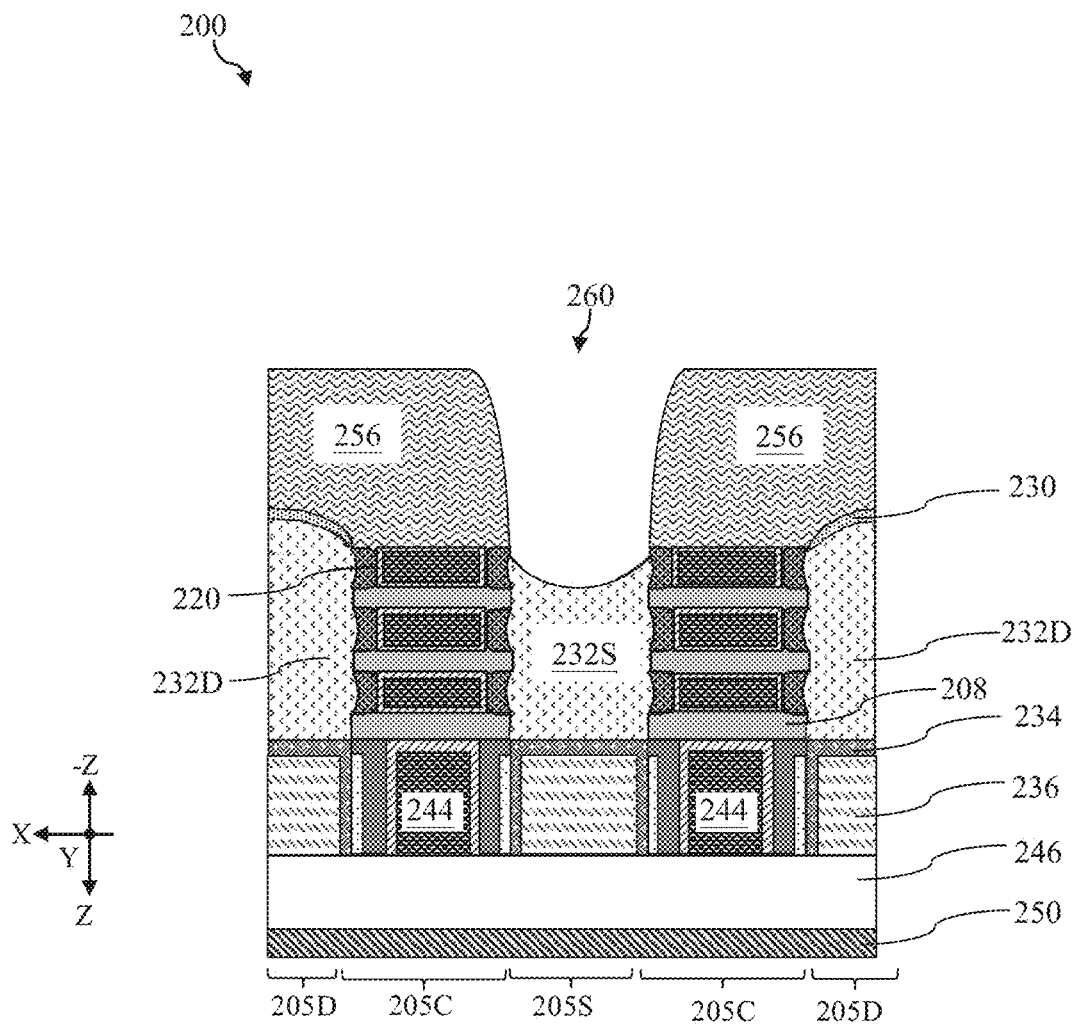

Referring to FIGS. 1 and 14-15, method 100 includes a block 126 where a dielectric layer 256 is formed in the dielectric opening 254 and the amorphous semiconductor plug 228' is selectively removed. The dielectric layer 256 may be deposited over a back side of the workpiece 200 by FCVD, CVD, PECVD, spin-on coating, or a suitable process. In some instances, the dielectric layer 256 may include silicon oxide or have a composition similar to that of the ILD layer 236. As shown in FIG. 14, after the dielectric layer 256 is formed, the drain features 232D are spaced apart from the dielectric layer 256 by the epitaxial semiconductor feature 230. A planarization process, such as a CMP process, may be performed to planarize the back side of the workpiece 200 and expose the amorphous semiconductor plug 228'. As shown in FIG. 15, the amorphous semiconductor plug 228' is then selectively removed. The selective removal of the amorphous semiconductor plug 228' may be self-aligned because the amorphous semiconductor plug 228', which is formed of a semiconductor material, is disposed among the dielectric layer 256, which is formed of dielectric materials. In these embodiments, the selective removal of the amorphous semiconductor plug 228' may be performed using a selective wet etching process or a selective dry etching process. An example selective wet etching process may include use of nitric acid. An example selective dry etching process may be in a way similar to the dry etching process used in the formation of the source opening 218S and drain openings 218D described with reference to FIG. 3. Because the selective etching process at block 126 etches the amorphous semiconductor plug 228' faster than it etches the dielectric layer 256, the amorphous semiconductor plug 228' may be removed with little or no damage to the dielectric layer 256. The etching process is stopped when the epitaxial semiconductor feature 230 disposed between the source feature 232S and the amorphous semiconductor plug 228' is removed. Thus, the source feature 232S is exposed in a backside source contact opening 260 from the back side of the workpiece 200.

Figure 16:
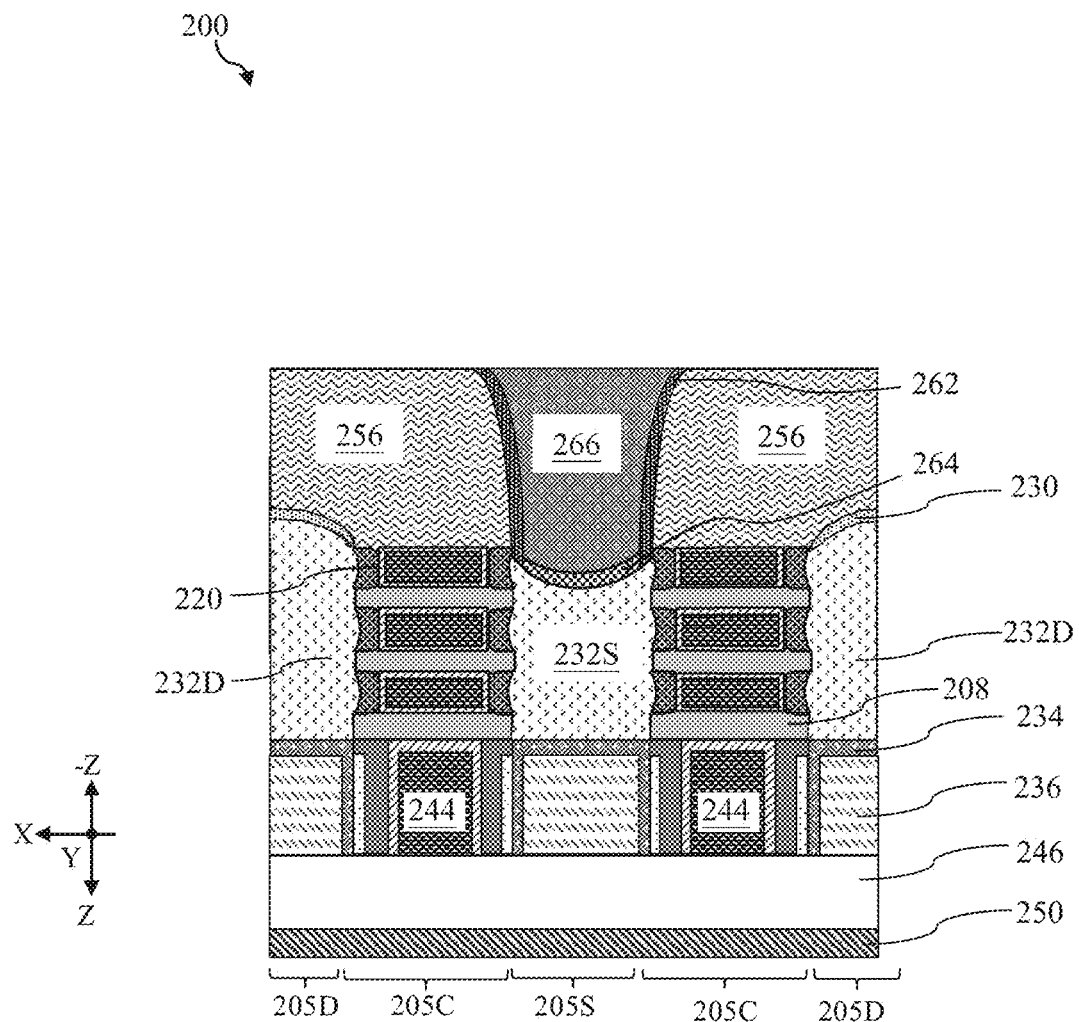

Referring to FIGS. 1 and 16, method 100 includes a block 128 where a backside source contact 266 is formed in the backside source contact opening 260. In this depicted example, a dielectric barrier layer 262 is deposited over the workpiece 200 and is then etched back to only cover sidewalls of the backside source contact opening 260 and expose the source feature 232S. In some embodiments, the dielectric barrier layer 262 may include silicon nitride or other suitable materials. Operations at block 128 also includes forming a silicide layer 264 on the exposed surface of the source feature 232S to reduce a contact resistance between the source feature 232S and the to-be-formed backside source contact 266. To form the silicide layer 264, a metal layer is deposited over the exposed surfaces of the source feature 232S and an anneal process is performed to bring about silicidation reaction between the metal layer and the source feature 232S. Suitable metal layer may include titanium, tantalum, nickel, cobalt, or tungsten. In embodiments where the metal layer includes nickel and the source feature 232S includes silicon germanium, the silicide layer 264 includes nickel silicide, nickel germanide, and nickel germanosilicide. The silicide layer 264 generally tracks the shape of the exposed source feature 232S. Excessive metal layer that does not form the silicide layer 264 may be removed. After the formation of the silicide layer 264, the backside source contact 266 may be formed in the backside source contact opening 260. The backside source contact 266 may include aluminum, rhodium, ruthenium, copper, iridium, or tungsten. A planarization process, such as a CMP process, may follow to remove excessive materials and provide a planar surface. The backside source contact 266 is electrically coupled to the source feature 232S by way of the silicide layer 264. In other words, the silicide layer 264 is sandwiched between the source feature 232S and the backside source contact 266.

Figure 17:
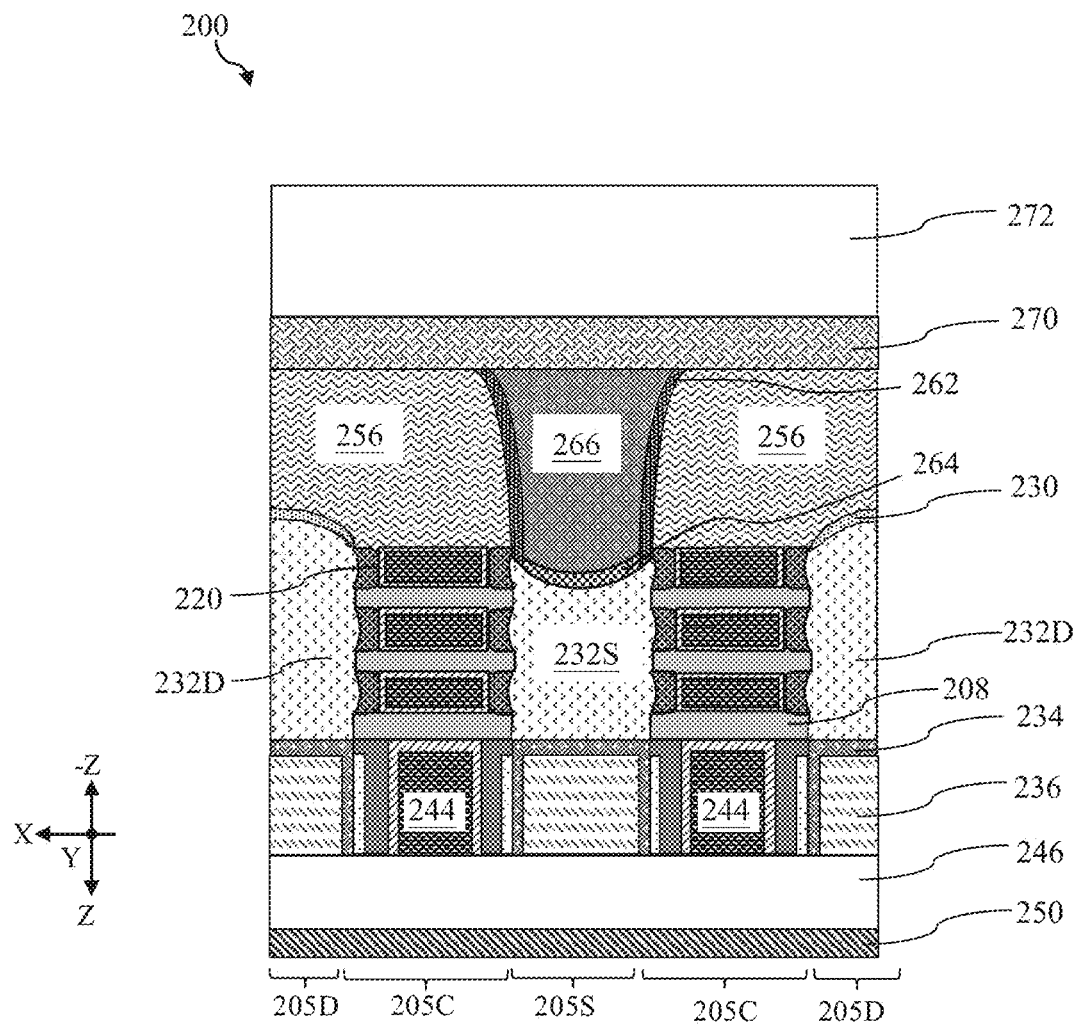
Figure 18:
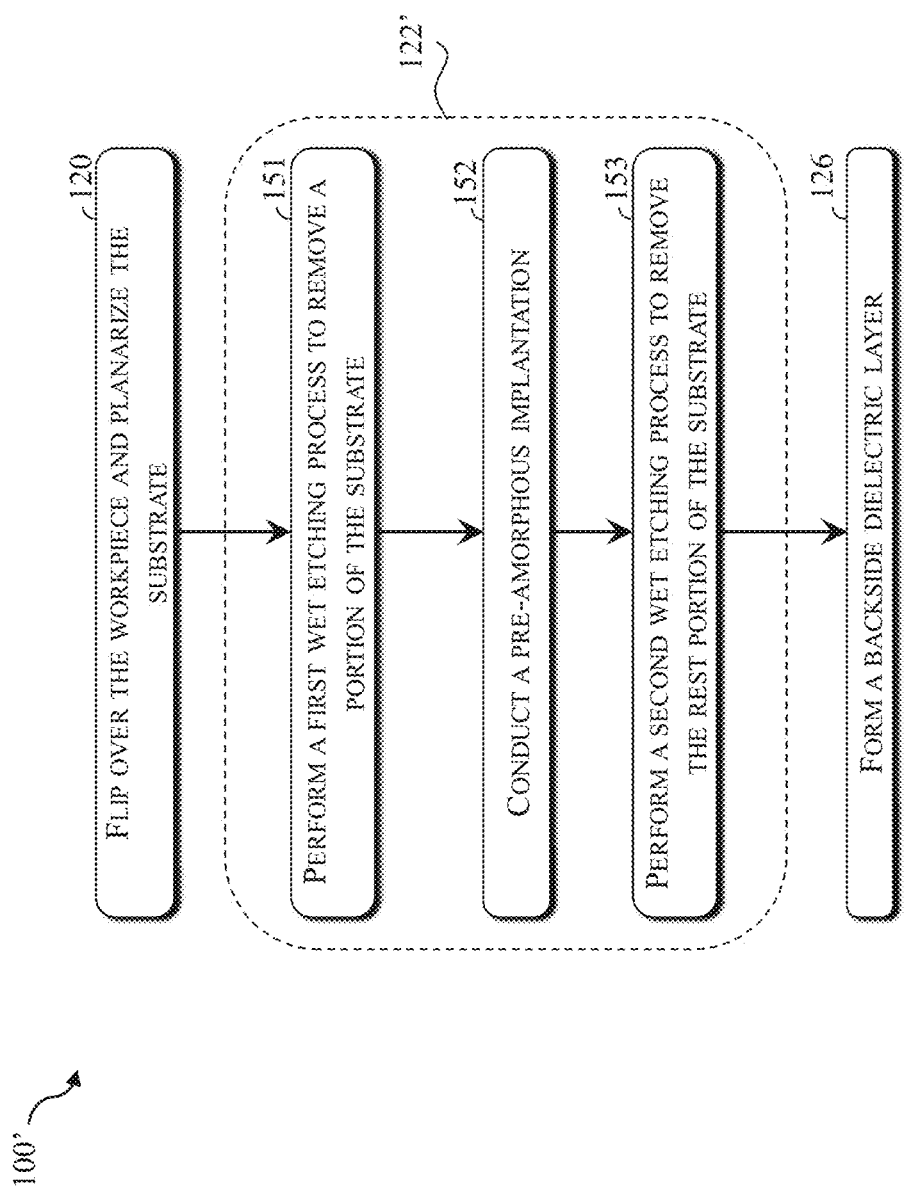
FIG. 18 illustrates a flow chart of another method for forming a semiconductor device having a backside power rail, according to one or more aspects of the present disclosure.

Referring to FIGS. 1 and 17, method 100 includes a block 130 where a backside power rail 270 is formed. While not explicitly shown in FIG. 17, the backside power rail 270 may be embedded in an insulation layer. In an exemplary process, an insulation layer having a composition similar to the ILD layer 236 may be deposited over the backside of the workpiece 200, including over the dielectric layer 256, the isolation feature, and the backside source contact 266. Then, a power rail trench may be patterned in the insulation layer. A barrier layer and a metal fill material are then deposited into the power rail trench to form the backside power rail 270. In some embodiments, the barrier layer in the backside power rail 270 may include titanium nitride, tantalum nitride, cobalt nitride, nickel nitride, or tungsten nitride and the metal fill material in the backside power rail 270 may include titanium, ruthenium, copper, nickel, cobalt, tungsten, tantalum, or molybdenum. The barrier layer and the metal fill layer may be deposited using PVD, CVD, ALD, or electroless plating. A planarization process, such as a CMP process, may be performed to remove excessive materials over the insulation layer. A second interconnect structure 272 is formed and has a structure in a way similar to the first interconnect structure 246. Because the second interconnect structure 272 is formed over the back side of the workpiece 200, the second interconnect structure 272 may also be referred to as a backside interconnect structure 272.

In methods and structures depicted above, the semiconductor layer 204 is removed as described in block 122 of method 100 in FIG. 1. As the same alkaline etchant etches crystalline semiconductor layer 204 at a rate much greater than it does the amorphous semiconductor layer 204', the duration of etching the amorphized semiconductor layer 204' may be prolonged. It is observed that, when an alkaline etchant is used, the etch rate of the amorphous semiconductor layer 204' may be between 0.1 and 0.5 times of the etch rate of the crystalline semiconductor layer 204. An alternative method 100' of selectively and substantially removing the semiconductor layer 204 is described with reference to FIG. 18 in conjunction with FIGS. 19-22. In this alternative method 100', block 122 of method 100 is replaced with block 122' to shorten the duration of the etching process used to remove the semiconductor layer 204. By reducing process time, the fabrication efficiency may be improved. Like block 122 of method 100, operations in block 122' of method 100' are configured to selectively remove the semiconductor layer 204 to form dielectric openings 254. Different from method 100, method 100' includes a first wet etching process before the PAI process 400a and a second wet etching process after the PAI process 400b. To take advantage of the faster pre-PAI etch rate, the first etching process is configured to remove a bulk portion of the semiconductor layer 204, leaving behind residual portions of the semiconductor layer 204 to protect the gate structure from the PAI processes 400a and 400b (to be discussed in detail with references to FIGS. 20-21). After the PAI processes 400a and 400b, a second wet etching process is performed to remove the amorphized residual portions, albeit at a slower etch rate.

Figure 19:
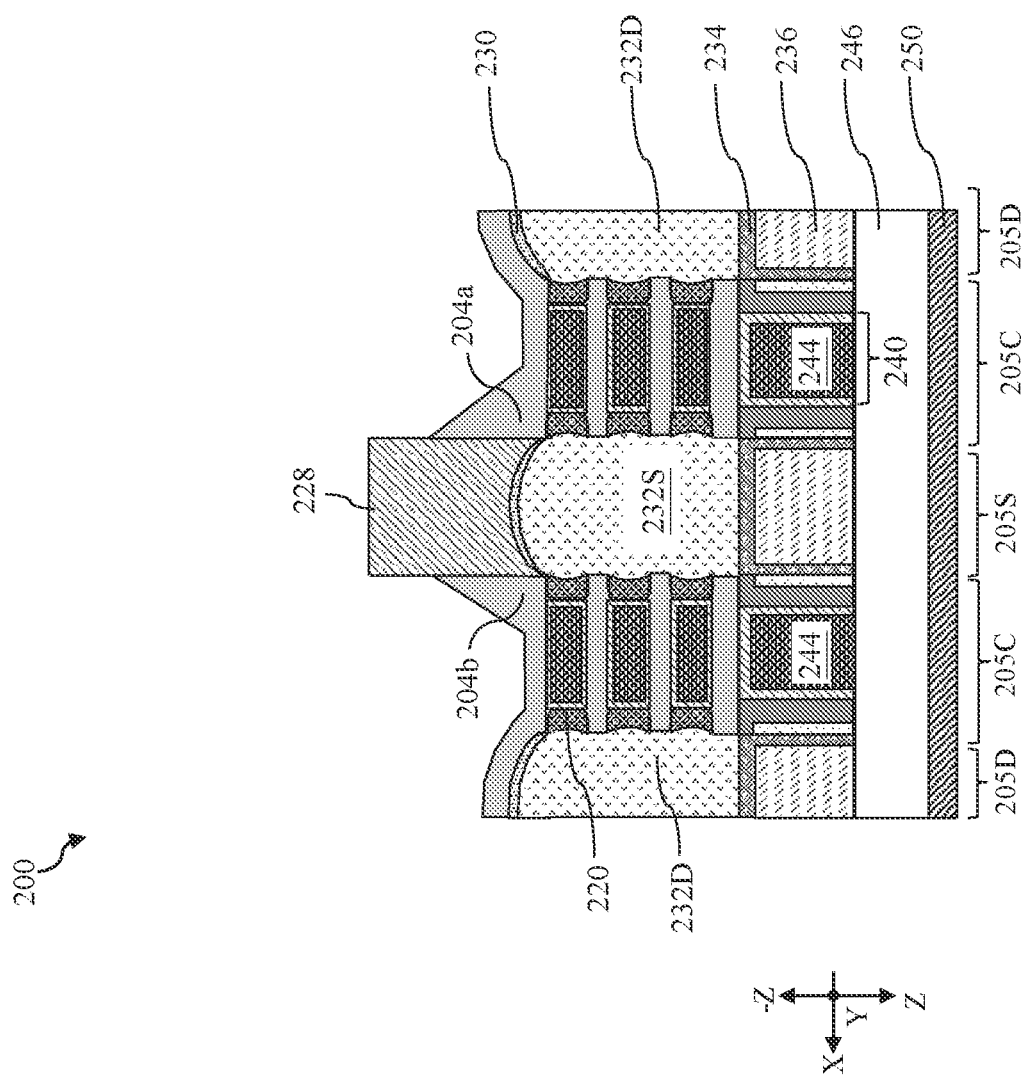
FIGS. 19-22 illustrate fragmentary cross-sectional views of a workpiece during various fabrication stages in the method of FIG. 18, according to one or more aspects of the present disclosure.

Referring first to FIGS. 18 and 19, method 100' includes block 151 where a first wet etching process is performed to remove a bulk portion of the semiconductor layer 204, leaving behind the unetched portions 204a and 204b (herein interchangeably referred as to silicon residues 204a and 204b) of the semiconductor layer 204, as shown in FIG. 19. It is noted that, the first etching process is timed or controlled such that the silicon residues 204a and 204b include a portion directly disposed on the gate structures 240 to reduce the damage suffered by the gate structures 240, which is induced by a PAI process that follows.

Figure 20:
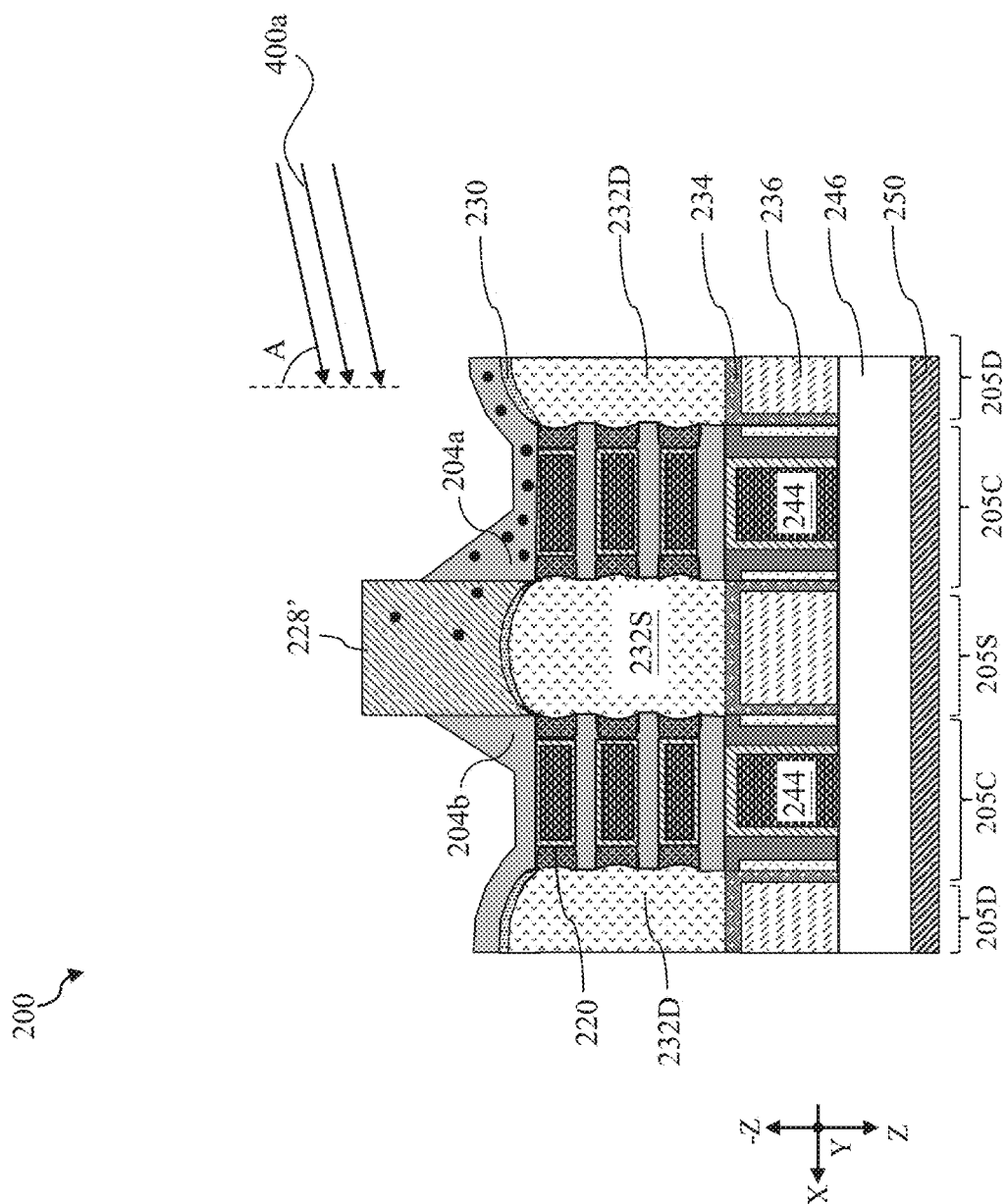
Figure 21:
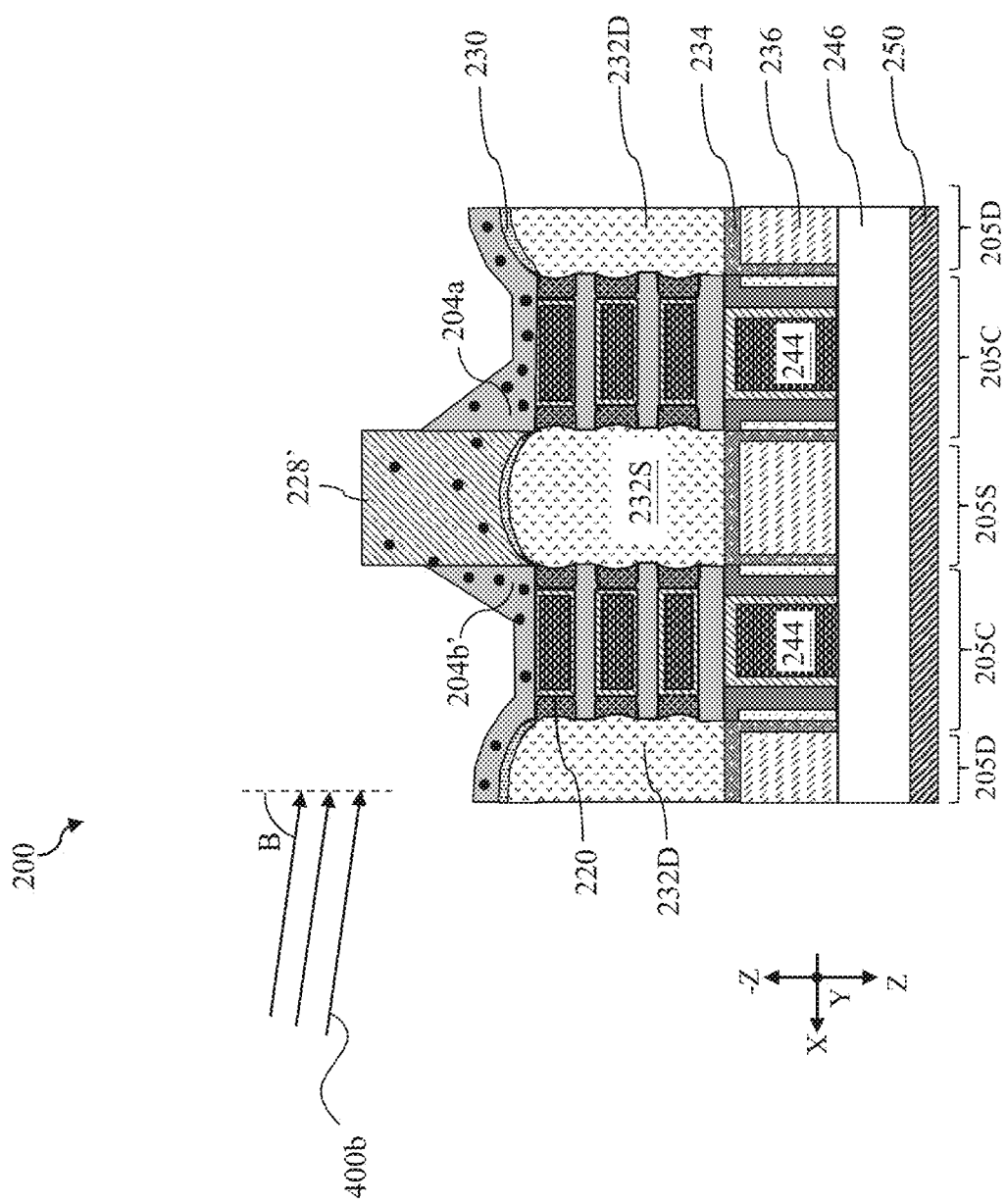

Now referring to FIGS. 18 and 20-21, block 122' also includes block 152 where a PAI process is performed to amorphize the silicon residues 204a and 204b. In this depicted example, as shown in FIG. 20, the PAI process in block 152 includes a first tilted PAI process 400a configured to amorphize the silicon residue 204a. As shown in FIG. 21, the PAI process in block 152 also includes a second tilted PAI process 400b configured to amorphize the silicon residue 204b. The first tilted PAI process 400a and the second tilted PAI process 400b implant the silicon residues 204a and 204b with an implant species, randomizing the lattice structure of these regions and forming amorphized silicon residues 204a' and 204b', respectively. The first tilted PAI process 400a and the second tilted PAI process 400b may implant a species, such as Si, C, Ge, Xe, Ar, B, or other suitable species. In the depicted embodiment, the first tilted PAI process 400a and the second tilted PAI process 400b implant Ge, Ar, or, B into the silicon residues 204a and 204b. A tilt angle A (shown in FIG. 20) between the implant ion beam of the first tilted PAI process 400a and the −Z axis may be between 45° and 85°. A tilt angle B (shown in FIG. 21) between the implant ion beam of the second tilted PAI process 400b and the −Z axis may be between 45° and 85°. In this embodiment, after the first tilted PAI process 400a and the second tilted PAI process 400b, the silicon residue 204a and 204b are fully amorphized, and the semiconductor plug 228 is at least partially amorphized and includes amorphous silicon germanium (a-SiGe). The gate structures 240 adjacent to the amorphous semiconductor layer 204' and the source feature 232S adjacent to the amorphous semiconductor plug 228' may also include the implant species used in the first and second PAI processes 400a and 400b.

In some embodiments, before performing the first and/or the second tilted PAI processes 400a and 400b, the workpiece 200 may be inspected, for example, by using transmission electron microscope (TEM), scanning electron microscope (SEM), or suitable optical scan methods to determine a shape, dimension, and location of the silicon residue. The first tilted PAI process 400a and/or the second tilted PAI process 400b may be configured based on the shape, dimension, and/or location of the silicon residue to substantially amorphize the silicon residue 204a and 204b.

Figure 22:
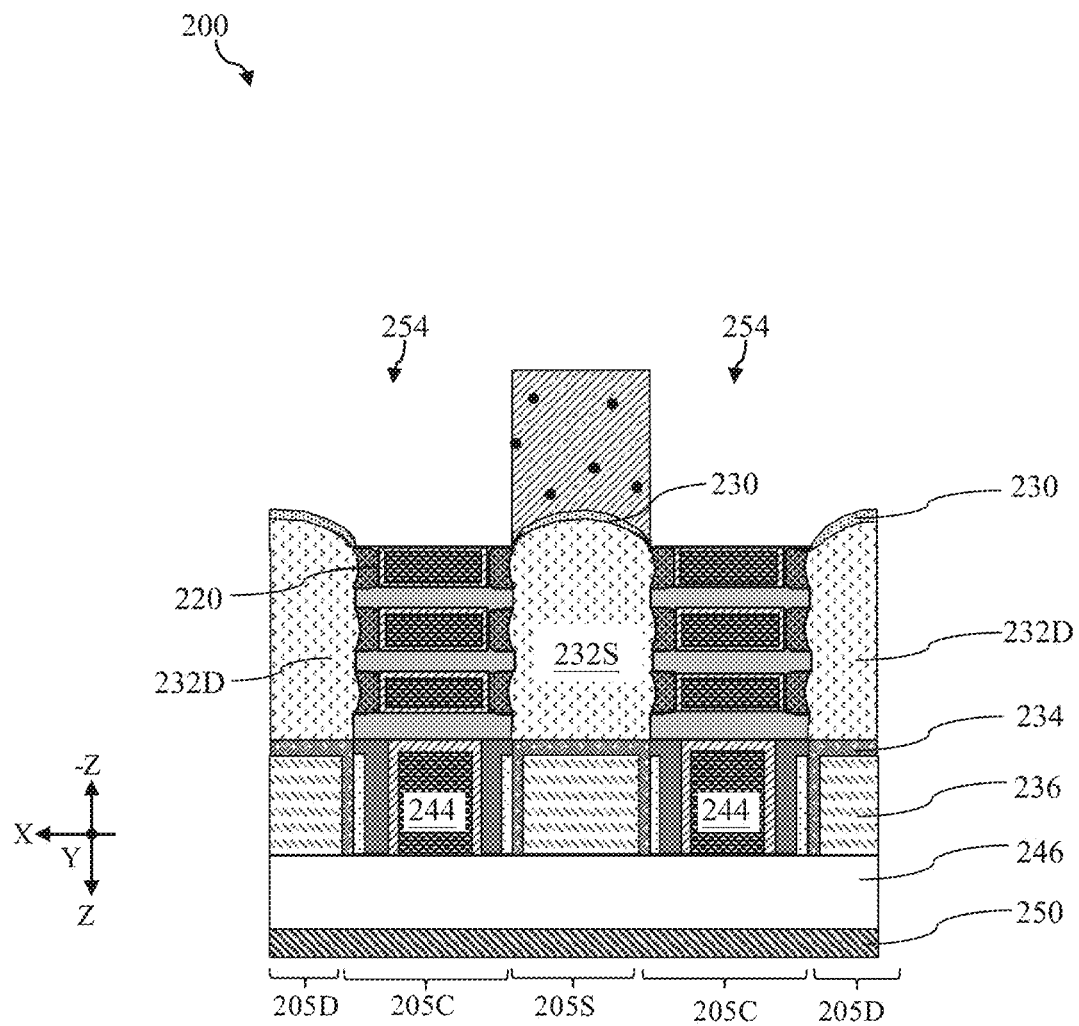

Referring to FIGS. 15 and 22, block 122' includes block 153 where a second etching process is conducted to selectively remove the amorphous silicon residues 204a' and 204b' to form the dielectric openings 254. Each of the first etching process (in block 151) and the second etching process (in block 153) may be a selective wet etching process that implements an alkaline wet etchant solution (e.g., includes KOH, TMAH, NH$_4$OH, other suitable chemicals, or combinations thereof). In some embodiments, the first etch process and the second etch process may use the same etchant with different concentrations. For example, a concentration of the etchant in the second etch process may be greater than the etchant in the first etch process to make up for the slower etch rate for the amorphized residual portions. Further processes may be performed in a way similar to those described in blocks 126, 128 and 130 and FIGS. 14-17 to form a backside source contact 266 and a backside power rail 270.

Embodiments of the present disclosure provide advantages. For example, methods of the present disclosure include processes for replacing a semiconductor layer with a dielectric layer and replacing a semiconductor plug with a backside contact. In some embodiments, before replacing the semiconductor layer with a dielectric layer, a PAI process is performed to amorphize the semiconductor layer. By implementing the PAI, the lattice structure in the semiconductor layer are randomized, and the semiconductor layer may be substantially removed by a wet etching process. Therefore, a leakage path, which would be introduced by the semiconductor residue, may be eliminated or substantially reduced. Moreover, a parasitic capacitance of the semiconductor structure may be advantageously reduced. Therefore, reliability and performances of the semiconductor structure may be thus improved.

The present disclosure provides for many different embodiments. Semiconductor structures and methods of fabrication thereof are disclosed herein. In one exemplary aspect, the present disclosure is directed to a method. The method includes forming a fin structure extending from a front side of a substrate, forming a gate stack over a channel region of the fin structure, recessing a source region and a drain region of the fin structure to form a source opening and a drain opening, the channel region being disposed between the source region and the drain region, extending the source opening into the substrate to form a plug opening, forming a semiconductor plug in the plug opening, planarizing the substrate to expose the semiconductor plug from a back side of the substrate, performing a pre-amorphous implantation (PAI) process to amorphize the substrate, replacing the amorphized substrate with a dielectric layer, and replacing the semiconductor plug with a backside source contact.

In some embodiments, the performing of the PAI process may include implanting germanium (Ge), argon (Ar), or boron (B) into the substrate and the semiconductor plug. In some embodiments, the replacing of the amorphized substrate with the dielectric layer may include performing a wet etching process to selectively remove the amorphized substrate to form a recess, depositing the dielectric layer in the recess, and planarizing the dielectric layer to expose the semiconductor plug. In some embodiments, the performing of the wet etching process may include implementing a KOH solution, a TMAH solution, or a $NH_4OH$ solution. In some embodiments, the substrate may include silicon, and the semiconductor plug may include silicon germanium, boron-doped silicon, or phosphorus-doped silicon. In some embodiments, the replacing of the semiconductor plug with the backside source contact may include selectively etching the semiconductor plug to release the plug opening, depositing a conductive material layer to fill the plug opening, and planarizing the conductive material layer to remove excessive conductive material layer.

In some embodiments, the fin structure may include a stack of first semiconductor layers and second semiconductor layers alternately arranged one over another, each of the first semiconductor layers may include silicon germanium, and each of the second semiconductor layers includes silicon. In some embodiments, the PAI process may include an implantation angle substantially perpendicular to the back side of the substrate.

In another exemplary aspect, the present disclosure is directed to a method. The method includes receiving a workpiece including a fin-shaped structure over a substrate, forming a source opening in the fin-shaped structure, extending the source opening into the substrate to form an extended opening, forming a sacrificial plug in the extended opening, forming a source feature in the source opening and over the sacrificial plug, planarizing a back side of the substrate to expose the sacrificial plug, after the planarizing, performing a pre-amorphous implantation (PAI) process to the workpiece to amorphize the substrate, performing a wet etching process to selectively remove the amorphized substrate, depositing a dielectric layer, and replacing the sacrificial plug with a backside source contact.

In some embodiments, the PAI process may include an implantation angle substantially perpendicular to the back side of the substrate. In some embodiments, the method may also include, before the performing of the PAI process, performing a pilot wet etching process to selectively and partially etch the substrate without substantially etching the sacrificial plug. In some embodiments, the pilot wet etching process may etch the substrate at a rate greater than a rate at which the wet etching process etches the amorphized substrate.

In some embodiments, the pilot wet etching process may include an etchant having a first concentration, the wet etching may include the etchant having a second concentration greater than the first concentration. In some embodiments, an angle between an ion beam of the PAI process and a back surface of the substrate may be between about 45° and 85°.

In some embodiments, the replacing of the sacrificial plug with the backside source contact may include selectively etching the sacrificial plug to expose the source feature in a backside source contact opening, selectively forming a dielectric liner on sidewalls of the backside source contact opening, forming a silicide layer on the source feature, and depositing a metal fill layer over the silicide layer in the backside source contact opening. In some embodiments, the method may also include, before the forming of the source feature, performing an epitaxial growth process to epitaxially grow an epitaxial layer over the sacrificial plug, wherein the epitaxial layer is formed of un-doped silicon germanium.

In yet another exemplary aspect, the present disclosure is directed to a method. The method includes providing a substrate including a first semiconductor layer on an insulator layer, forming a stack of second semiconductor layers and third semiconductor layers alternately arranged one over another on the substrate, patterning the stack to form a fin-shaped structure over the insulator layer, forming a gate structure over the fin-shaped structure, recessing the fin-shaped structure to form a source opening and a drain opening, selectively extending the source opening further into the first semiconductor layer to form a backside contact opening, forming a sacrificial layer in the backside contact opening, forming a source feature in the source opening and over the sacrificial layer, planarizing a back side of the substrate to remove the insulator layer and expose the sacrificial layer and the first semiconductor layer, implanting a dopant to the back side of the substrate to convert the first semiconductor layer into an amorphous semiconductor layer, replacing the amorphous semiconductor layer with a dielectric layer, and replacing the sacrificial layer with a backside source contact.

In some embodiments, the first semiconductor layer and the third semiconductor layers may include silicon, the second semiconductor layers may include silicon germanium (SiGe), and the sacrificial layer may include silicon germanium, boron-doped silicon, or phosphorus-doped silicon. In some embodiments, the method may also include, after the forming of the source feature, forming a first interconnect structure over the source feature and electrically connected to the gate structure, and, after forming the backside source contact, forming a second interconnect structure electrically connected to the backside source contact, wherein the second interconnect structure includes a backside power rail in contact with the backside source contact. In some embodiments, the replacing of the amorphous semiconductor layer with the dielectric layer may include performing a wet etching process to selectively remove the amorphous semiconductor layer to form a recess, depositing the dielectric layer in the recess, and planarizing the dielectric layer to expose the sacrificial layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure extending from a front side of a substrate;
    forming a gate stack over a channel region of the fin structure;
    recessing a source region and a drain region of the fin structure to form a source opening and a drain opening, the channel region being disposed between the source region and the drain region;
    extending the source opening into the substrate to form a plug opening;
    forming a semiconductor plug in the plug opening;
    planarizing the substrate to expose the semiconductor plug from a back side of the substrate;
    performing a pre-amorphous implantation (PAI) process to amorphize the substrate;
    replacing the amorphized substrate with a dielectric layer; and
    replacing the semiconductor plug with a backside source contact.

2. The method of claim 1, wherein the performing of the PAI process comprises implanting germanium (Ge), argon (Ar), or boron (B) into the substrate and the semiconductor plug.

3. The method of claim 1, wherein the replacing of the amorphized substrate with the dielectric layer comprising:
    performing a wet etching process to selectively remove the amorphized substrate to form a recess;
    depositing the dielectric layer in the recess; and
    planarizing the dielectric layer to expose the semiconductor plug.

4. The method of claim 3, wherein the performing of the wet etching process comprises implementing a KOH solution, a TMAH solution, or a NH$_4$OH solution.

5. The method of claim 1, wherein the substrate is formed of silicon, and the semiconductor plug comprises silicon germanium, boron-doped silicon, or phosphorus-doped silicon.

6. The method of claim 1, wherein the replacing of the semiconductor plug with the backside source contact comprises:
    selectively etching the semiconductor plug to release the plug opening;
    depositing a conductive material layer to fill the plug opening; and
    planarizing the conductive material layer to remove excessive conductive material layer.

7. The method of claim 1, wherein the fin structure includes a stack of first semiconductor layers and second semiconductor layers alternately arranged one over another, each of the first semiconductor layers comprises silicon germanium, and each of the second semiconductor layers comprises silicon.

8. The method of claim 1, wherein the PAI process comprises an implantation angle substantially perpendicular to the back side of the substrate.

9. A method, comprising:
    receiving a workpiece comprising a fin-shaped structure over a substrate;
    forming a source opening in the fin-shaped structure;
    extending the source opening into the substrate to form an extended opening;
    forming a sacrificial plug in the extended opening;
    forming a source feature in the source opening and over the sacrificial plug;
    planarizing a back side of the substrate to expose the sacrificial plug;
    after the planarizing, performing a pre-amorphous implantation (PAI) process to the workpiece to amorphize the substrate;
    performing a wet etching process to selectively remove the amorphized substrate;
    depositing a dielectric layer; and
    replacing the sacrificial plug with a backside source contact.

10. The method of claim 9, wherein the PAI process comprises an implantation angle substantially perpendicular to the back side of the substrate.

11. The method of claim 9, further comprising:
    before the performing of the PAI process, performing a pilot wet etching process to selectively and partially etch the substrate without substantially etching the sacrificial plug.

12. The method of claim 11, wherein the pilot wet etching process etches the substrate at a rate greater than a rate at which the wet etching process etches the amorphized substrate.

13. The method of claim 11,
    wherein the pilot wet etching process includes an etchant having a first concentration,
    wherein the wet etching includes the etchant having a second concentration greater than the first concentration.

14. The method of claim 13, wherein an angle between an ion beam of the PAI process and a back surface of the substrate is between about 45° and 85°.

15. The method of claim 9, wherein the replacing of the sacrificial plug with the backside source contact comprises:
    selectively etching the sacrificial plug to expose the source feature in a backside source contact opening;

selectively forming a dielectric liner on sidewalls of the backside source contact opening;

forming a silicide layer on the source feature; and depositing a metal fill layer over the silicide layer in the backside source contact opening.

16. The method of claim 9, further comprising:

before the forming of the source feature, performing an epitaxial growth process to epitaxially grow an epitaxial layer over the sacrificial plug, wherein the epitaxial layer is formed of un-doped silicon germanium.

17. A method, comprising:

providing a substrate comprising a first semiconductor layer on an insulator layer;

forming a stack of second semiconductor layers and third semiconductor layers alternately arranged one over another on the substrate;

patterning the stack to form a fin-shaped structure over the insulator layer;

forming a gate structure over the fin-shaped structure;

recessing the fin-shaped structure to form a source opening and a drain opening;

selectively extending the source opening further into the first semiconductor layer to form a backside contact opening;

forming a sacrificial layer in the backside contact opening;

forming a source feature in the source opening and over the sacrificial layer;

planarizing a back side of the substrate to remove the insulator layer and expose the sacrificial layer and the first semiconductor layer;

implanting a dopant to the back side of the substrate to convert the first semiconductor layer into an amorphous semiconductor layer;

replacing the amorphous semiconductor layer with a dielectric layer; and replacing the sacrificial layer with a backside source contact.

18. The method of claim 17, wherein the first semiconductor layer and the third semiconductor layers comprise silicon, the second semiconductor layers comprise silicon germanium (SiGe), and the sacrificial layer is formed of silicon germanium, boron-doped silicon, or phosphorus-doped silicon.

19. The method of claim 17, further comprising:

after the forming of the source feature, forming a first interconnect structure over the source feature and electrically connected to the gate structure; and, after forming the backside source contact, forming a second interconnect structure electrically connected to the backside source contact, wherein the second interconnect structure comprises a backside power rail in contact with the backside source contact.

20. The method of claim 17, wherein the replacing of the amorphous semiconductor layer with the dielectric layer comprising:

performing a wet etching process to selectively remove the amorphous semiconductor layer to form a recess;

depositing the dielectric layer in the recess; and planarizing the dielectric layer to expose the sacrificial layer.

* * * * *